(12) United States Patent
Bains et al.

(10) Patent No.: US 10,872,011 B2
(45) Date of Patent: Dec. 22, 2020

(54) INTERNAL ERROR CHECKING AND CORRECTION (ECC) WITH EXTRA SYSTEM BITS

(71) Applicant: Intel Corporation, Santa Clara, CA (US)

(72) Inventors: Kuljit S. Bains, Olympia, WA (US); Bill Nale, Livermore, CA (US); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 609 days.

(21) Appl. No.: 15/540,798

(22) PCT Filed: May 2, 2017

(86) PCT No.: PCT/US2017/030695
§ 371 (c)(1),
(2) Date: Jun. 29, 2017

(87) PCT Pub. No.: WO2017/192626
PCT Pub. Date: Nov. 9, 2017

(65) Prior Publication Data
US 2018/0210787 A1    Jul. 26, 2018

Related U.S. Application Data

(60) Provisional application No. 62/330,338, filed on May 2, 2016.

(51) Int. Cl.
*G06F 11/10* (2006.01)
*G11C 11/409* (2006.01)
(Continued)

(52) U.S. Cl.
CPC ...... *G06F 11/1068* (2013.01); *G06F 11/1012* (2013.01); *G11C 11/409* (2013.01);
(Continued)

(58) Field of Classification Search
CPC ............ G06F 11/1068; G06F 11/1048; G06F 11/1012; G11C 29/52; G11C 11/4093;
(Continued)

(56) References Cited

U.S. PATENT DOCUMENTS 6,052,818 A    4/2000  Dell et al.
7,620,875 B1   11/2009 Nelson et al.
(Continued)

OTHER PUBLICATIONS

International Search Report and Written Opinion for PCT Patent Application No. PCT/US2017/030695, dated Aug. 8, 2017, 12 pages.
(Continued)

*Primary Examiner* — Albert Decady
*Assistant Examiner* — Enam Ahmed
(74) *Attorney, Agent, or Firm* — Compass IP Law PC

(57) ABSTRACT

A memory subsystem includes a data bus to couple a memory controller to one or more memory devices. The memory controller and one or more memory devices transfer data for memory access operations. The data transfer includes the transfer of data bits and associated check bits over a transfer cycle burst. The memory devices include internal error checking and correction (ECC) separate from the system ECC managed by the memory controller. With a 2N transfer cycle for $2^N$ data bits for a memory device, the memory devices can provide up to 2N memory locations for N+1 internal check bits, which can leave up to (2N minus (N+1)) extra bits to be used by the system for more robust ECC.

23 Claims, 15 Drawing Sheets

(51) Int. Cl.
  *G11C 11/4093* (2006.01)
  *G11C 29/52* (2006.01)
  *G11C 29/04* (2006.01)
  *G11C 7/10* (2006.01)
  *G11C 29/42* (2006.01)

(52) U.S. Cl.
  CPC .......... *G11C 11/4093* (2013.01); *G11C 29/52* (2013.01); *G11C 7/1006* (2013.01); *G11C 29/42* (2013.01); *G11C 2029/0411* (2013.01)

(58) Field of Classification Search
  CPC ............... G11C 11/409; G11C 7/1006; G11C 2029/0411; G11C 29/42
  USPC .......................................................... 714/764
  See application file for complete search history.

(56) References Cited

U.S. PATENT DOCUMENTS

| | | | | |
|---|---|---|---|---|
| 8,495,467 | B1* | 7/2013 | Billing | G11C 29/42 |
| | | | | 714/764 |
| 8,996,960 | B1* | 3/2015 | Saxena | G06F 11/1048 |
| | | | | 714/773 |
| 9,431,054 | B1* | 8/2016 | Goker | G06F 11/1076 |
| 2006/0218469 | A1 | 9/2006 | Klein | |
| 2007/0016724 | A1* | 1/2007 | Gaither | G06F 12/023 |
| | | | | 711/105 |
| 2010/0169729 | A1 | 7/2010 | Datta et al. | |
| 2011/0055647 | A1 | 3/2011 | Maeda et al. | |
| 2011/0145678 | A1 | 6/2011 | Agarwal et al. | |
| 2012/0254700 | A1 | 10/2012 | McGinnis et al. | |
| 2014/0160876 | A1* | 6/2014 | Gupta | G06F 12/0207 |
| | | | | 365/238.5 |
| 2014/0281808 | A1* | 9/2014 | Lam | G11C 16/26 |
| | | | | 714/764 |
| 2015/0082122 | A1 | 3/2015 | Udipi et al. | |
| 2015/0205665 | A1 | 7/2015 | Kuo et al. | |
| 2015/0331745 | A1 | 11/2015 | Zastrow | |
| 2016/0004595 | A1* | 1/2016 | Thiruvengadam | G06F 3/064 |
| | | | | 714/764 |
| 2016/0011940 | A1* | 1/2016 | Hu | G06F 11/108 |
| | | | | 714/764 |
| 2016/0048425 | A1* | 2/2016 | Kim | G11C 29/52 |
| | | | | 714/764 |
| 2016/0134307 | A1 | 5/2016 | Hu et al. | |
| 2016/0139989 | A1 | 5/2016 | Muralimanohar et al. | |
| 2016/0283318 | A1 | 9/2016 | Das et al. | |
| 2016/0284424 | A1* | 9/2016 | Das | G06F 3/064 |
| 2017/0063394 | A1* | 3/2017 | Halbert | G06F 11/1068 |
| 2017/0286214 | A1 | 10/2017 | Vaidhyanathan et al. | |
| 2018/0314591 | A1* | 11/2018 | Reed | G06F 11/106 |

OTHER PUBLICATIONS

Extended European Search Report for Patent Application No. 17793191.2, dated Sep. 19, 2019, 7 pages.

* cited by examiner

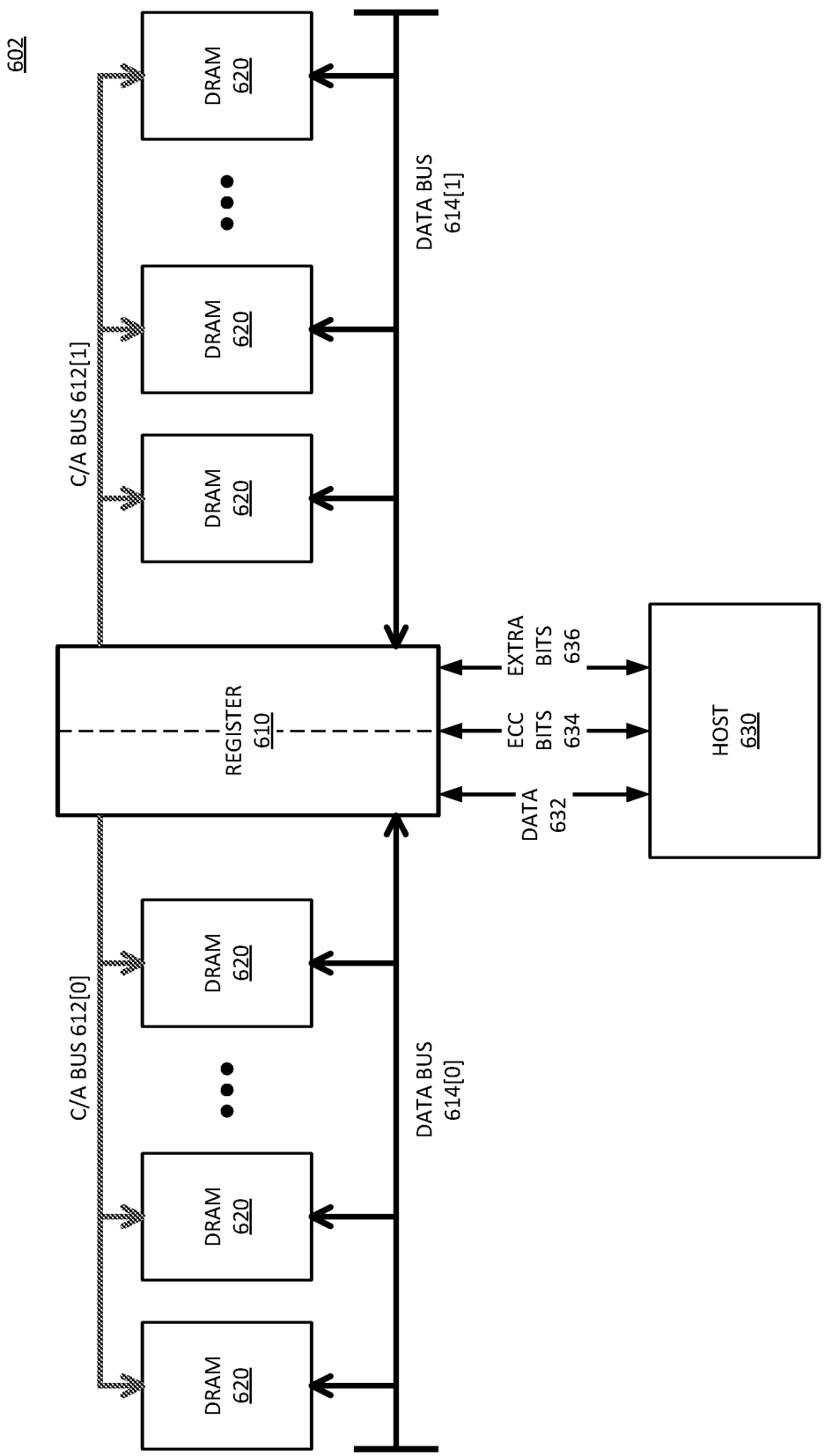

INTERNAL ERROR CHECKING AND CORRECTION (ECC) WITH EXTRA SYSTEM BITS

CLAIM OF PRIORITY

This application is a U.S. National Phase application under 35 U.S.C. § 371 of International Application No. PCT/US17/30695, filed May 2, 2017, entitled "INTERNAL ERROR CHECKING AND CORRECTION (ECC) WITH EXTRA SYSTEM BITS", which in turn is based on U.S. 62/330,338, entitled, "INTERNAL ERROR CHECKING AND CORRECTION (ECC) WITH EXTRA SYSTEM BITS", the entire contents of which are incorporated herein by reference. The present application claims the benefit of priority of these applications.

FIELD

The descriptions are generally related to memory devices, and more particular descriptions are related to error checking and correction within memory systems.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, 2017, Intel Corporation, All Rights Reserved.

BACKGROUND

Memory devices continue to be an essential part of electronic devices and computer systems. Memory densities continue to increase as feature geometries shrink, but scaling to smaller geometries continues to increase the number of errors in memories. One technique for addressing memory errors is to employ ECC (error checking and correction, which may also be referred to as error correction coding). Traditionally a memory controller performs error detection and correction, including generating check bits to send with data, which the memory device stores on a write operation and returns on a read operation. When the memory controller performs the error correction, the memory controller and memory devices exchange the ECC bits or check bits, which increases the bandwidth of the data bus (e.g., increase a channel from 64 bits or signal lines to 72, or from 32 bits or signal lines to 36). Increasing numbers of ECC bits would be needed to continue to meet RAS (reliability, accessibility, and serviceability) expectations in modern memory subsystems, which suggests increasing the data bus width with more signal lines to accommodate additional ECC bits needed to perform higher levels of error correction. However, increasing the bus width increases costs and consumes additional power.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 6A is a block diagram of an embodiment of a system with a register for DRAM devices that provide extra system bits for system ECC.

Figure 1:
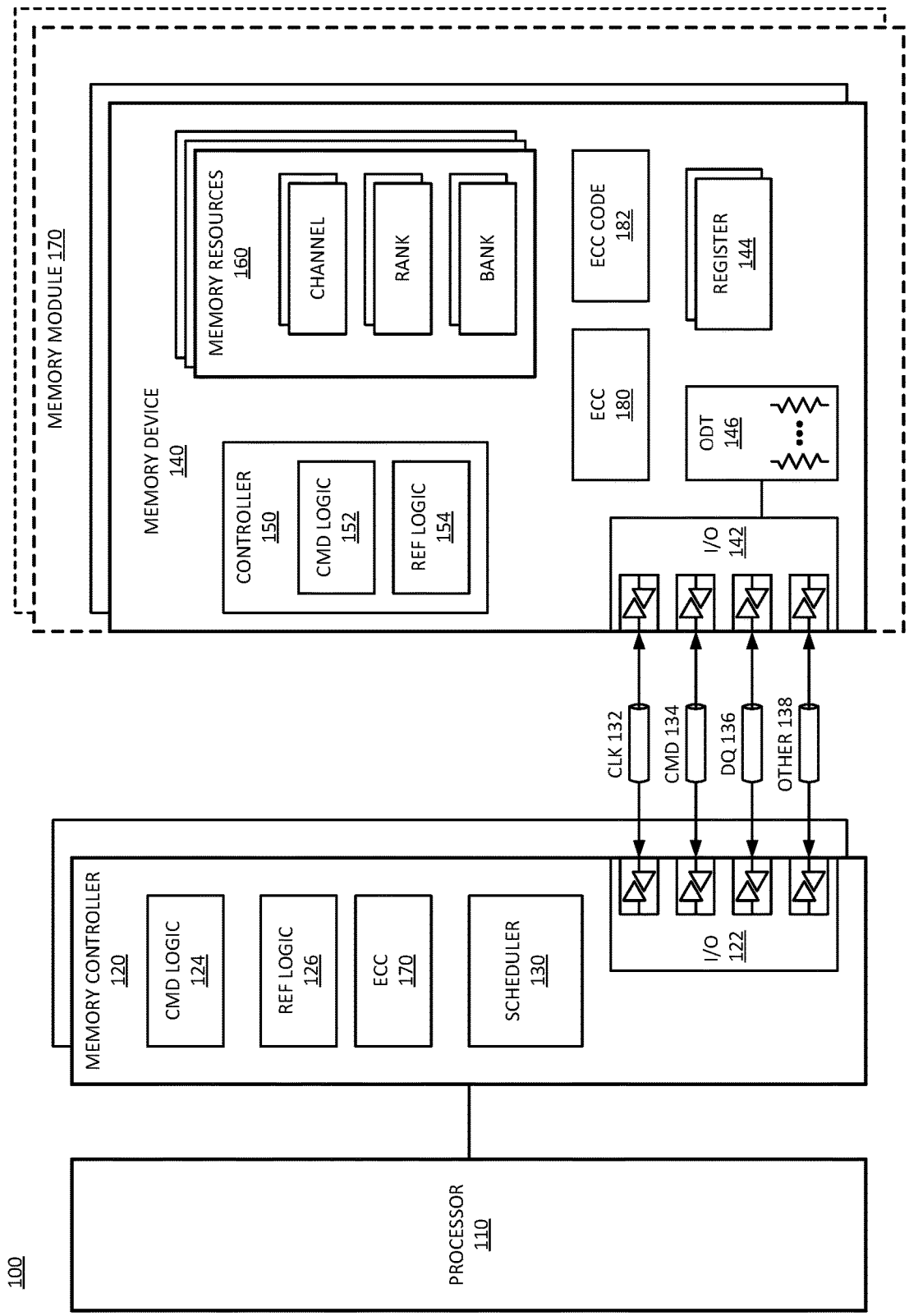
FIG. 1 is a block diagram of an embodiment of a system with memory that exchanges extra system bits with traditional ECC bits.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, the application of error checking and correction (ECC) can scale per channel without increasing the overhead required for the application of ECC. The scaling of the ECC allows providing more check bits to apply a higher level of ECC without increasing the channel width. In one embodiment, higher levels of ECC can be provided without increasing the percentage of total bandwidth used for check bits relative to traditional ECC approaches. There is a logarithmic relationship between the number of bits required to provide ECC and the number of bits being protected by ECC. For example, if B+1 check bits are used for single error correction (SEC) for $2^B$ data bits (for example, 8 check bits for 128 (2^7) data bits), twice as many data bits (2^(B+1) data bits) can be protected with SEC with B+2 check bits (for example, 9 check bits for 256 data bits).

It will be understood that ECC is also commonly used as an acronym for error correction coding or error correction codes. Error correction codes refer to the codes used to perform computations. Error correction coding may be used interchangeably with error checking and correction, where error checking and correction refers to the process of using one or more codes to generate check bits, or using check bits to verify the validity of data, or a combination. Error checking and correction is to be understood in an expansive sense of checking for and potentially correcting detected errors, and ECC can be generally understood to refer to error checking and correction.

ECC operations can be performed in accordance with an ECC algorithm, referring to a series or sequence of consecutive operations to perform ECC. An ECC algorithm includes computations to generate ECC bits or use the bits to determine the validity of data or a combination. Typically, ECC logic performs ECC operations. The ECC logic can include ECC circuitry that performs computations. ECC bits or check bits refer to the ECC code for validating data or a codeword. Typical ECC operations include a series of XOR (exclusive OR) operations on a codeword with corresponding ECC bits to generate an expected result.

A traditional approach to data transfer in memory systems is to send 128 data bits in a burst of 8 transfer cycles (or burst length 8 (BL8)). It will be understood that 8 check bits can be transferred one per transfer cycle or unit interval (UI) of the memory access transaction. In a configuration where, for example, 16×4 memory devices are coupled in parallel, each device may contribute 64 bits of a total 512 data bits, with two extra devices being used to provide an additional 64 bits of ECC and system metadata, for a total of 576 bits transferred between a host and the group of memory devices. Increasing to BL16 would provide for 128 data bits from each ×4 memory device, which is twice the traditional 64 bits, which can reduce the number of devices required on a channel from 16+2 to 8+1 for the same number of bits. However, by reducing the number of memory devices in half, extra ECC or metadata or a combination of ECC and metadata would be needed to provide the same level of ECC protection, such as being able to recover from a full device failure.

It will be understood that more robust ECC operations require additional system bits, which cannot be provided in the traditional scenario without increasing the overhead to include another memory device (in the implementation described above, there would be 8+2 memory devices). As such, a memory controller can generate more check bits to transmit with the data bits on a write operation, and receive the check bits back on a read operation. However, with a traditional approach, the added overhead of the extra device and the additional 64 bits in the BL16 implementation is more than is necessary to provide similar ECC protection as in the case of 16+2 memory devices for BL8.

In one embodiment, the memory devices are capable of performing on-die or internal ECC, where the memory device itself includes ECC logic to perform ECC at the memory device separate from the ECC managed by the memory controller. On-die ECC refers to ECC operations where the memory device itself generates and stores check bits for write data, and applies the check bits to correct data prior to sending the data to the memory controller for read data. Thus, there is a distinction between ECC where the memory controller generates and checks the check bits, and where the memory device itself performs the checking. It will be understood that where a memory device performs internal or on-die ECC, the memory controller does not have visibility into the internal check bits, and may not even know if an error was corrected.

In one embodiment, a memory device applies internal ECC with 9 bits for 256 data bits. The closest binary number larger than 9 is 16, which means the memory device can provide or allocate 16 bits for ECC information, and only needs 9. In one embodiment, the memory device can provide access to the memory controller to up to the 7 extra bits for system ECC information or metadata or a combination. While the example of 9 bits for 256, and 16 bits is provided, in general the memory device can provide up to (2N minus (N+1)) extra bits based on a 2N transfer cycle for 2^N data bits within the memory device, based on the memory device using or allocating 2N memory locations for N+1 internal check bits for on-die ECC. It will be understood that the approach may be generally applicable to a system in which N is greater than 1.

Thus, in one embodiment a system enables the use of extra system bits in memory access operations for memory devices with on-memory or on-die ECC. Extra system bits refer to bits that can be stored in a memory device and exchanged with a memory controller for purposes of operation of the hardware platform. The exchange of data can occur with either a read memory access operation or a write memory access operation. The exchange for a read operation can refer to an operation where a memory device fetches and transmits data to a memory controller in response to a read access request. The exchange of data can also refer to a write operation where the memory controller provides data to the memory device to store in its memory array(s).

System-level bits can be understood as data bits used as metadata within the hardware components of a system (e.g., the hardware platform) to control or enhance, or both, the operations of the hardware components. In one embodiment, system-level bits are not controlled by the host operating system (OS), and may not even be visible to the host OS that provides a software platform for the execution of applications in a general purpose operation of a computing device. In one embodiment, the exchange and use of the system-level bits described is limited to operation of the memory subsystem.

In one embodiment, in addition to on-die ECC, a memory device can store additional system bits, which can be accessed by the memory controller to perform platform-level system operations. In one embodiment, the memory controller can access the system bits but not the internal ECC bits. In one embodiment, the memory device protects the system ECC bits from corruption by applying the on-die ECC bits to both the data bits and the system ECC bits. In one embodiment, the memory device does not perform internal ECC operations on the extra system bits. In an alternate embodiment, the memory can perform internal ECC operations on the extra system bits. In one embodiment, the system architecture provides for up to 2 system bits per 64 data bits, where some exchanges may include 1 extra system bit, and other exchanges may include 2 extra system bits. In one embodiment, the system bit exchange occurs on a separate data signal line or separate lane from the data bus. In one embodiment, system bit exchange on a separate lane is provided with slower signals than the data signals. Thus, a system bit exchange can span multiple UIs instead of sending a data bit in every UI of an access transaction. In one embodiment, the system bit exchange occurs in a separate UI after a typical data transaction burst length (e.g., a 17th UI after 16 UIs of data transfer for the read/write transaction for a BL16 implementation).

FIG. 1 is a block diagram of an embodiment of a system with memory that exchanges extra system bits with traditional ECC bits. System 100 includes a processor and elements of a memory subsystem in a computing device. Processor 110 represents a processing unit of a computing platform that may execute an operating system (OS) and applications, which can collectively be referred to as the host or the user of the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 100 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAM devices in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a memory bus, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 170, I/O 142 can include interface hardware of the memory module in addition to interface hardware on the memory device itself. Other memory controllers 120 will include separate interfaces to other memory devices 140.

The bus between memory controller 120 and memory devices 140 can be implemented as multiple signal lines coupling memory controller 120 to memory devices 140. The bus may typically include at least clock (CLK) 132, command/address (CMD) 134, and write data (DQ) and read DQ 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one embodiment, independent channels have different clock signals, C/A buses, data buses, and other signal lines. Thus, system 100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction. In one embodiment, CMD 134 represents signal lines shared in parallel with multiple memory devices. In one embodiment, multiple memory devices share encoding command signal lines of CMD 134, and each has a separate chip select (CS_n) signal line to select individual memory devices.

It will be understood that in the example of system 100, the bus between memory controller 120 and memory devices 140 includes a subsidiary command bus CMD 134 and a subsidiary bus to carry the write and read data, DQ 136. In one embodiment, the data bus can include bidirectional lines for read data and for write/command data. In another embodiment, the subsidiary bus DQ 136 can include unidirectional write signal lines for write and data from the host to memory, and can include unidirectional lines for read data from the memory to the host. In accordance with the chosen memory technology and system design, other signals 138 may accompany a bus or sub bus, such as strobe lines DQS. Based on design of system 100, or implementation if a design supports multiple implementations, the data bus can have more or less bandwidth per memory device 140. For example, the data bus can support memory devices that have either a ×32 interface, a ×16 interface, a ×8 interface, or other interface. The convention "×W," where W is an integer that refers to an interface size or width of the interface of memory device 140, which represents a number of signal lines to exchange data with memory controller 120. The interface size of the memory devices is a controlling factor on how many memory devices can be used concurrently per channel in system 100 or coupled in parallel to the same signal lines. In one embodiment, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one embodiment, memory devices 140 and memory controller 120 exchange data over the data bus in a burst, or a sequence of consecutive data transfers. The burst corresponds to a number of transfer cycles, which is related to a bus frequency. In one embodiment, the transfer cycle can be a whole clock cycle for transfers occurring on a same clock or strobe signal edge (e.g., on the rising edge). In one embodiment, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 140 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., ×16 or ×8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same command and data buses. In another embodiment, multiple memory devices 140 are connected in parallel to the same command bus, and are connected to different data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word. As non-limiting examples, a specific memory device can provide or receive, respectively, 8 bits of a 128-bit data word for a Read or Write transaction, or 4 bits or 8 bits or 16 bits (depending on whether it is a ×4 or a ×8 or a ×16 device) of a 256-bit data word. The remaining bits of the word will be provided or received by other memory devices in parallel.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 170. In one embodiment, memory modules 170 represent dual inline memory modules (DIMMs). In one embodiment, memory modules 170 represent other organization of multiple memory devices to share at least a portion of access or control circuitry, which can be a separate circuit, a separate device, or a separate board from the host system platform. Memory modules 170 can include multiple memory devices 140, and the memory modules can include support for multiple separate channels to the included memory devices disposed on them. In another embodiment, memory devices 140 may be incorporated into the same package as memory controller 120, such as by techniques such as multi-chip-module (MCM), package-on-package, through-silicon VIA (TSV), or other techniques or combinations. Similarly, in one embodiment, multiple memory devices 140 may be incorporated into memory modules 170, which themselves may be incorporated into the same package as memory controller 120. It will be appreciated that for these and other embodiments, memory controller 120 may be part of host processor 110.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels may refer to independent control paths to storage locations within memory devices 140. Ranks may refer to common locations across multiple memory devices (e.g., same row addresses within different devices). Banks may refer to arrays of memory locations within a memory device 140. In one embodiment, banks of memory are divided into sub-banks with at least a portion of shared circuitry (e.g., drivers, signal lines, control logic) for the sub-banks. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "mode," where command information can trigger different operations within memory device 140 based on the mode. Additionally or in the alternative, different modes can also trigger different operation from address information or other signal lines depending on the mode. Settings of register 144 can indicate configuration for I/O settings (e.g., timing, termination or ODT (on-die termination) 146, driver configuration, or other I/O settings).

In one embodiment, memory device 140 includes ODT 146 as part of the interface hardware associated with I/O 142. ODT 146 can be configured as mentioned above, and provide settings for impedance to be applied to the interface to specified signal lines. In one embodiment, ODT 146 is applied to DQ signal lines. In one embodiment, ODT 146 is applied to command signal lines. In one embodiment, ODT 146 is applied to address signal lines. In one embodiment, ODT 146 can be applied to any combination of the preceding. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading. ODT 146 can be applied to specific signal lines of I/O interface 142, 122, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller, and is separate from memory controller 120 of the host. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses. Controller 150 includes command logic 152, which can decode command encoding received on command and address signal lines. Thus, command logic 152 can be or include a command decoder. With command logic 152, memory device can identify commands and generate internal operations to execute requested commands.

Referring again to memory controller 120, memory controller 120 includes scheduler 130, which represents logic or circuitry to generate and order transactions to send to memory device 140. From one perspective, the primary function of memory controller 120 could be said to schedule memory access and other transactions to memory device 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 120 typically includes logic to allow selection and ordering of transactions to improve performance of system 100. Thus, memory controller 120 can select which of the outstanding transactions should be sent to memory device 140 in which order, which is typically achieved with logic much more complex that a simple first-in first-out algorithm. Memory controller 120 manages the transmission of the transactions to memory device 140, and manages the timing associated with the transaction. In one embodiment, transactions have deterministic timing, which can be managed by memory controller 120 and used in determining how to schedule the transactions.

Referring again to memory controller 120, memory controller 120 includes command (CMD) logic 124, which represents logic or circuitry to generate commands to send to memory devices 140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 140, memory controller 120 can issue commands via I/O 122 to cause memory device 140 to execute the commands. In one embodiment, controller 150 of memory device 140 receives and decodes command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can implement compliance with standards or specifications by access scheduling and control.

In one embodiment, memory controller 120 includes refresh (REF) logic 126. Refresh logic 126 can be used for memory resources that are volatile and need to be refreshed to retain a deterministic state. In one embodiment, refresh logic 126 indicates a location for refresh, and a type of refresh to perform. Refresh logic 126 can trigger self-refresh within memory device 140, or execute external refreshes which can be referred to as auto refresh commands) by sending refresh commands, or a combination. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In one embodiment, memory controller includes ECC logic 170 to manage error checking and correction in memory accesses of system 100. ECC logic 170 can include ECC hardware that performs ECC computations and stores results. In one embodiment, memory device 140 includes internal ECC managed by ECC logic 180. ECC logic 180 can include ECC hardware that performs ECC computations and stores results. ECC logic 170 of memory controller 120 manages system wide ECC, and can detect and correct errors across multiple different memory resources in parallel (e.g., multiple memory devices 140). ECC logic 170 can generate check bits that it will send to memory device 140 for storage with a write operation, and which will be returned with a read operation. Many techniques for system wide ECC are known, and can include ECC logic 170 managing memory resources in a way to spread errors across multiple resources. By spreading errors across multiple resources, memory controller 120 can recover data even in the event of one or more failures in memory device 140. Memory failures are generally categorized as either soft errors or soft failures, which are transient bit errors typically resulting from random environmental conditions, or hard errors or hard failures, which are non-transient bit errors occurring as a result of a hardware failure. As described herein, system ECC can be improved by scaling up the protection level on a channel by channel basis.

ECC logic 180 of memory device 140 manages one or more errors occurring in the memory resources 160. The use of ECC within memory device 140 may be referred to as internal ECC or on-die ECC, or internal on-die ECC. In general, internal ECC refers to ECC implemented within memory device 140, without command or management of the ECC operations by memory controller 120 or the host. With internal ECC, in response to a write request, ECC logic 180 generates ECC bits to store with the data sent by memory controller 120. In response to a read request, ECC logic 180 checks and corrects an error in the data prior to presenting the data to memory controller 120 to satisfy the request. In one embodiment, SEC data provided from memory device 140 via operations of ECC logic 180 is indistinguishable at memory controller 120 from data with no errors.

In one embodiment, system 100 has extra system bits available for ECC or other system functions, or a combination. In one embodiment, memory controller 120 can provide extra system bits to memory device 140, and the same extra bits can be returned by the memory device in response to a read request. In one embodiment, ECC logic 180 covers the additional system bits via the same ECC code 182 or other ECC mechanism used to protect the integrity of the data bits. In one embodiment, memory devices 140 provide extra system bits to memory controller 120, which can include bits exchanged during UI transfers for internal ECC bits, where there are more UI transfers for internal ECC bits than there are internal ECC bits to transfer. In one embodiment, memory controller 120 can write the extra bits as additional commands or controls for memory devices 140, and memory devices 140 can return internal ECC information with the extra system bits.

In one embodiment, one or more memory devices 140 includes an additional signal line (in addition to the DQ signal lines or the memory bus interface, e.g., ×4, ×8, or other). Such an implementation can be referred to as having an additional lane or out of band signal to transfer the extra system bits. In one embodiment, the memory device does not include an additional signal line to transfer the additional system bits, but transfers with another transfer cycle. A transfer cycle refers to a period of time based on a clock or timing signal. The transfer cycle can be referred to as a unit interval (UI). Memory transfers commonly occur over the DQ signal lines over a burst of N UIs, such an 8 cycle or UI burst length or burst length of 8 (BL8), or a 16 UI burst length (BL16). In one embodiment, system 100 could employ a BL16 for transferring data, followed by a single UI transfer for the extra system bits on the DQ signal lines. In one embodiment, system 100 could employ a BL16 for transferring data and ECC and extra system bits without an additional UI.

Figure 2A:
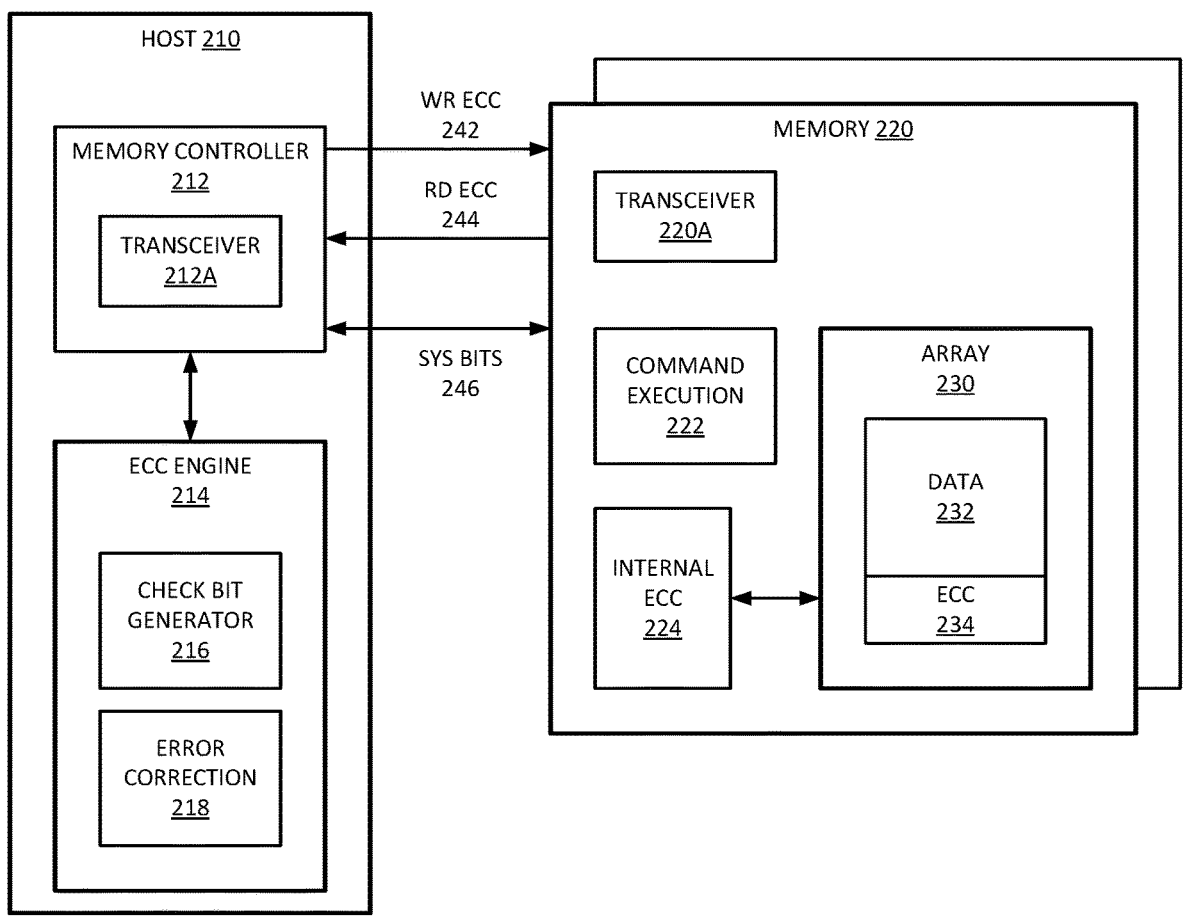
FIG. 2A is a block diagram of an embodiment of a system in which a memory device and memory controller exchange extra bits in addition to ECC check bits.

FIG. 2A is a block diagram of an embodiment of a system in which a memory device and memory controller exchange extra bits in addition to ECC check bits. System 202 represents a memory subsystem, and provides an example of a system that can be in accordance with system 100 of FIG. 1.

Host 210 represents a central processor or SOC, which executes the primary control functions of system 202. Host 210 includes processor hardware (not specifically shown). Host 210 includes memory controller 212, which can be hardware separate from the processor hardware, or integrated as a module onto the host processor. Host 210 includes ECC engine 214, which can be implemented as hardware within memory controller 212, or as hardware separate from memory controller 212. In an implementation where ECC engine 214 operates on hardware outside memory controller 212, the ECC engine will coordinate ECC operations with the transfer and receipt of data by memory controller 212. In system 202, ECC can be provided on a hardware platform level, and lower than a level that is controlled by a host OS. Thus, in one embodiment, ECC operations within system 202 occur at the level of host hardware, and there is not software executed by or controlled by the host operating system that controls the ECC.

In one embodiment, ECC engine 214 includes check bit generator 216 and error correction logic 218. Check bit generator 216 generates check bits for data sent to memory 220. In one embodiment, check bit generator 216 includes hardware to perform XOR operations on data to generate the check bits. Error correction logic 218 computes the same or a complementary computation on received data and compares the results to the received check bits. In one embodiment, error correction logic 218 includes hardware to perform XOR operations on data to perform error checking, including comparing against received check bits.

Memory 220 includes a controller or processor hardware to direct the operations of the memory device. The control hardware can execution command execution logic 222 to perform operations in response to commands from host 210. For example, in response to a write command, command execution logic 222 can control operations to store transferred data (not explicitly shown) along with write ECC 242 into memory array 230. As another example, in response to a read command, command execution logic 222 can control operations to fetch read data (not explicitly shown) along with read ECC 244 from memory array 230. In the ideal scenario, read ECC 244 will match write ECC 242 for the same memory address space. Array 230 can include any type of memory structure consistent with the application of ECC, and can store data 232 and ECC 234. ECC 234 represents check bits that corresponds with user data bits of data 232. In one embodiment, ECC 234 is stored together with the data. In one embodiment, ECC 234 is stored in a separate memory chip from where data 232 is stored.

In one embodiment, memory 220 includes internal ECC 224, which can include logic executed by the internal controller or on separate hardware, or a combination. Internal ECC 224 enables memory 220 to generate and apply check bits within the memory, independent ECC check bits provided by host 210. In one embodiment, internal ECC bits are stored within memory array 230. Thus, array 230 may store two types of ECC bits: check bits for internal ECC and check bits for system ECC. While shown as two types of ECC check bits, it will be understood that internal ECC and system ECC are separate, and in general the check bits and ECC operations of one are not related to the check bits and ECC operations of the other. In one embodiment, with parallel memory devices, only one will store both system check bits and internal check bits, while all may store internal check bits. With internal ECC 234, memory 220 can perform separate error checking and correction on data received from host 210, and prior to sending fetched data back to host 210.

In one embodiment, system bits 246 represent additional bits exchanged between ECC engine 214 and memory 220. System bits 246 provide an example of extra bits in accordance with any embodiment described herein. System bits 246 can provide additional information for ECC or other purposes. In one embodiment, system bits 246 represent other system metadata used by host 210. In one embodiment, host 210 and memory 220 exchange system bits 246 in extra UIs provided by an excess of UIs that are more than what is needed to transfer write ECC 242 and read ECC 244. The additional UIs are provided to transfer extra bits that memory 220 can store with additional memory locations available beyond what is needed for internal ECC operations. For example, the excess UIs can be the result of additional signal lines distributed among parallel memory devices, which provides UIs in addition to those used to transfer the data bits and check bits associated with the data. In one embodiment, the excess UIs can be the result of an extended command operation, such as by defining an access operation (e.g., read or write) to include UIs more than what are necessary to transfer the data and associated check bits.

It will be understood that ECC engine 214 provides ECC operations for memory controller 212. Memory controller 212 includes a hardware I/O interface to couple memory 220, which can include a data bus and command bus and other signals. Transceiver 212A represents transmit and receive circuitry within memory controller 212 to send and receive, respectively, data to and from memory 220. Transceiver 220A represents transmit and receive circuitry within memory 220 to send and receive, respectively, data to and from memory controller 212. Memory controller 212 sends data for write transactions, where a transaction includes sending a command and a burst operation to transmit data related to the command. Memory controller 212 receives data for read transactions. On the other side, memory 220 receives data for write transactions and sends data for read transactions.

In one embodiment, memory 220 provides internal ECC for $2^N$ data bits protected by least N+1 check bits. In one embodiment, the memory device has 2N memory locations for the N+1 internal check, and can use the additional memory locations for system bits.

Figure 2B:
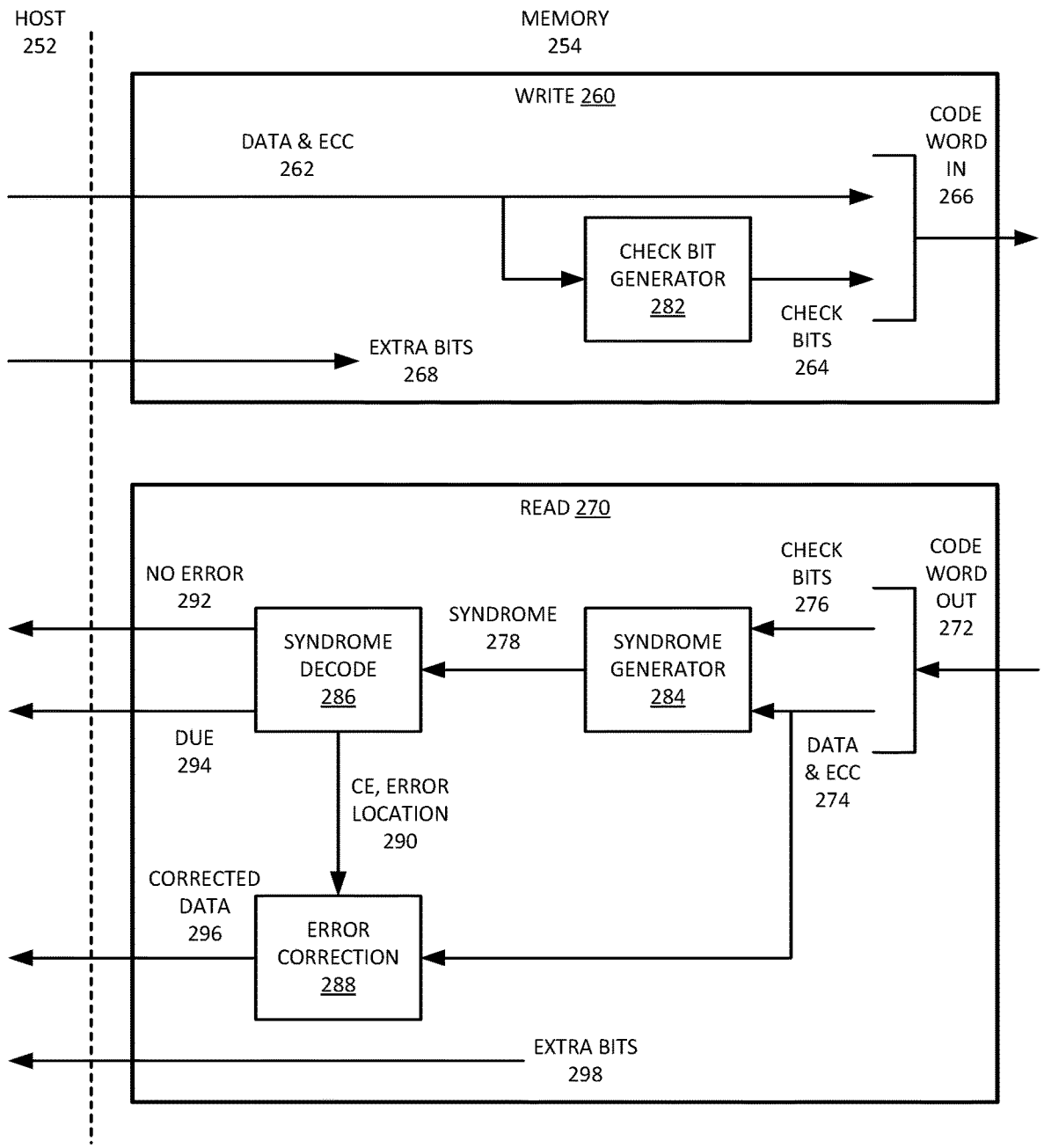
FIG. 2B is a block diagram of an embodiment of internal error checking and correction circuitry for a memory device.

FIG. 2B is a block diagram of an embodiment of internal error checking and correction circuitry for a memory device. System 204 is one example of a memory subsystem in accordance with system 100 of FIG. 1. Host 252 includes a memory controller or equivalent or alternative circuit or component that manages access to memory 254. In one embodiment, the memory controller is integrated on a processor chip (e.g., iMC). Host 252 performs external ECC on data read from and written to memory 254.

System 204 illustrates write path 260 in memory 254, which represents a path for data and ECC check bits and extra bits 268 written from host 252 to memory 254. Host 252 provides data and other bits to memory 254 for writing to the memory array(s). In one embodiment, data and ECC bits 262 includes system ECC bits from the memory controller to write in memory 254. In one embodiment, memory 254 generates check bits 264 with check bit generator 282 to store with the data in memory. In one embodiment, check bits 264 cover both the data bits (e.g., the user data or the data generated by operation of the OS) and the system ECC bits. Check bits 264 can enable memory 254 to correct an error that might occur in the writing to and reading from the memory array(s). Data and ECC bits 262 and check bits 264 can be included as code word in 266, which is written to the memory resources. It will be understood that check bits 264 represent internal check bits within the memory device. In one embodiment, there is no write path to check bits 264 from host 252. In one embodiment, there is a write path to check bits 264 only for purposes of testing the code matrix of memory 254. In one embodiment, host 252 sends extra bits 268 for storing in memory 254. Extra bits 268 can include additional ECC information or system metadata or a combination. In one embodiment, extra bits 268 can be protected by check bits 264. In one embodiment, extra bits 268 are not covered by internal ECC. Memory 254 has more space allocated for internal check bits 264 than needed to store the internal check bits, and memory 254 stores extra bits 268 with internal check bits 264 in the extra space.

Read path 270 represents a path for data read from memory 254 to host 252. In one embodiment, at least certain hardware components of write path 260 and read path 270 are the same hardware. In one embodiment, memory 254 fetches code word out 272 in response to a Read command from host 252. The code word can include data and system ECC 274 and check bits 276. Data and ECC bits 274 and check bits 276 can correspond, respectively, to data and ECC bits 262 and check bits 264 written in write path 260, if the address location bits of the write and read commands are the same. Similarly, memory 254 can provide extra bits 298 to host 252, such as data bits stored with check bits 276. If extra bits 268 are covered by internal ECC, extra bits 298 will be covered by the internal ECC operations of read path 270. It will be understood that error correction in read path 270 can include the application of an XOR (exclusive OR) tree (e.g., a sequence of XOR circuits) to a corresponding H matrix to detect errors and selectively correct errors (in the case of a single bit error). As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one embodiment, memory 254 includes syndrome decode 284, which enables the memory to apply check bits 276 to data and ECC bits 274 to detect errors in the read data. Syndrome decode 284 can generate syndrome 278 for use in generating appropriate error information for the read data. Data and ECC bits 274 can also be forwarded to error correction 288 for correction of a detected error.

As is understood in the art, an H matrix refers to a hamming code parity-check matrix that shows how linear combinations of digits of the code word equal zero. In one embodiment, the ECC includes XORing ECC check bits with an identical version generated as the syndrome, which results in zeros. Thus, the H matrix rows can identify the coefficients of parity check equations that must be satisfied for a component or digit to be part of a code word. In one embodiment, memory 254 includes syndrome generator 284 to generate an error vector or syndrome 278. In one embodiment, check bit generator 282 and syndrome generator 284 are fully specified by a corresponding H matrix for the memory device.

In one embodiment, syndrome generator 284 passes syndrome 278 to syndrome decode 286, which enables the memory to apply check bits 276 to data 274 to detect errors in the read data. Syndrome decode 286 can check syndrome 278 against an ECC code vector or code matrix stored in memory 254. Data 274 can also be forwarded to error correction 288 for correction of a detected error.

In one embodiment, if there are no errors in the read data (e.g., zero syndrome 278), syndrome decode 286 can pass the data to host 252 as no error 292. In one embodiment, if there is a single bit error (e.g., non-zero syndrome 278 that matches one of the columns of the H matrix), syndrome decode 286 can generate a CE (corrected error) signal with error location 290, which is a corrected error indication to error correction logic 288. Error correction 288 can apply the corrected error to the specified location in data 274 to generate corrected data 296 for writing to host 252. In one embodiment, if there are multiple errors in the read data (e.g., non-zero syndrome 278 that does not match any of the columns in a corresponding H matrix), syndrome decode 286 generates DUE (detected uncorrected error) 294, which indicates a detected, uncorrected error. DUE 294 can indicate a multibit error that memory 254 was not able to correct by internal ECC.

In one embodiment, syndrome decode 286 applies separate functions for the following conditions. In the case of a zero syndrome, syndrome decode 286 can pass no error data 292 to host 252. In the case of a non-zero syndrome that matches one of the columns of the H-matrix, the ECC engine can flip or toggle the corresponding bit to create a corrected error signal (CE). Error correction 288 can perform the actual data correction by changing the identified bit 290. In one embodiment, in the case of a non-zero syndrome that does not match any column, syndrome decode sends the erroneous data to host 252. Corrected data 296 sent from error correction logic 288 is sent when a corresponding code is found in the matrix. In one embodiment, syndrome decode 286 identifies data as DUE 294.

In one embodiment, the error correction logic of read path 270 generates one or more bits that are transmitted to a register or controller on a memory module. In one embodiment, the controller can send information as extra bits to host 252 in additional UIs provided by extending the burst length. In one embodiment, memory 254 only sends no error data 292 or corrected data 296 and system check bits to host 252. The extra bit can be based on the value of DUE 294, or based on whether or not an error correction was performed.

FIGS. 3A-3D are table representations of embodiments of storage and exchange of extra system bits. Diagrams 302, 304, 306, and 308 illustrate different options for storing internal ECC and extra system bits.

Figure 3A:
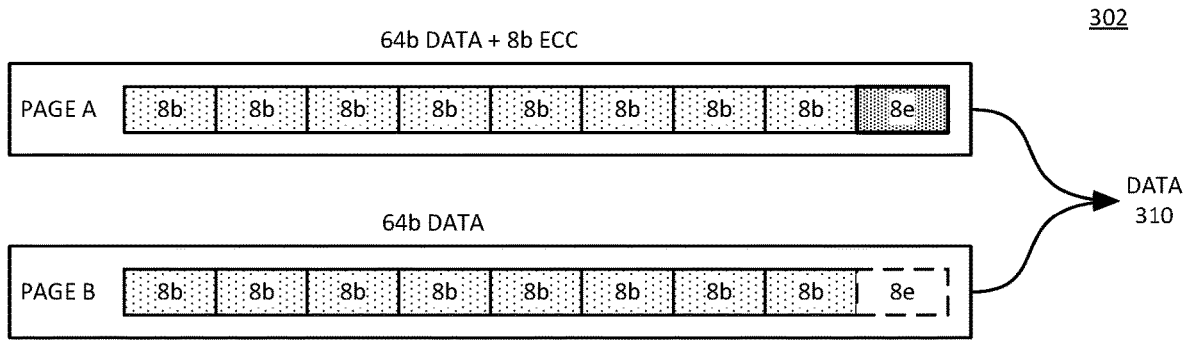
FIGS. 3A-3D are table representations of embodiments of storage and exchange of extra system bits.

Referring to diagram 302 of FIG. 3A, the system includes ½ K (512 bits) pages, and each operation operates on 64 bits of data per page. It will be understood that while ½ K pages are illustrated, 1 K page size or other page sizes could be used. Furthermore, the same principles can be applied with respect to additional system bits whether the number of bits is 64 bits per page, or some other number of bits, and whether the number of bits accessed per operation is 128 bits or some other number of bits. In one embodiment, the different pages are accessed from different memory arrays. For example, a memory die can include two sides, with 64 bits of access to both sides. The access can be from one or multiple banks.

In diagram 302, there are 8 memory locations for internal ECC and extra bits for the 128 bits illustrated, and the memory device stores all 8 ECC and extra bits in a single page. The memory device spreads the data across the two pages. Thus, Page A includes 64 bits of data plus 8 bits allocated for internal ECC or ECC plus system bits. Page B includes 64 bits of data, and no ECC bits. In one embodiment, the memory device stores extra system bits in a location not shown, which can be in addition to the data bits and ECC bits illustrated. In one embodiment, the extra system bits can be stored in two separate pages or in a single page, and/or the memory array from which the data bits are read or to which the data bits are written. Data 310 represents 128 bits of data with associated 8 bits of ECC bits or ECC and extra system bits. It will be understood that while 8 bits of ECC and extra bits are illustrated for 128 bits of data, the amounts of data can vary; for example, FIG. 3D illustrates a similar diagram where four pages of memory are illustrated.

Figure 3B:
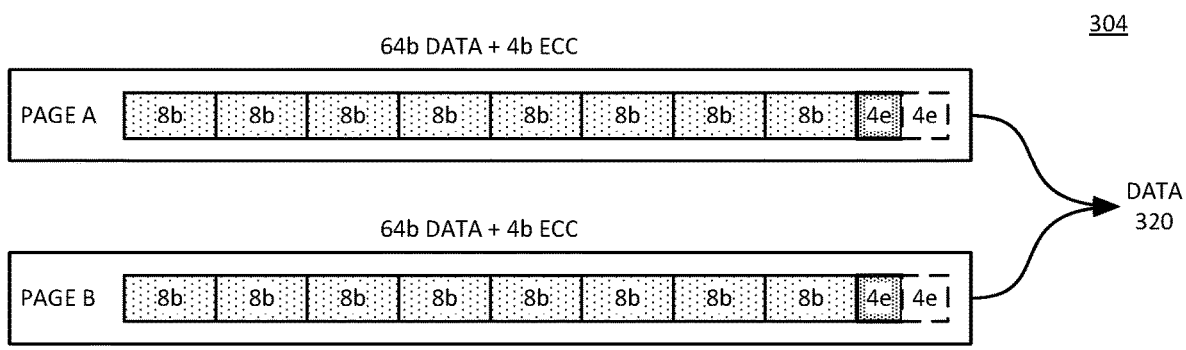

Referring to diagram 304 of FIG. 3B, the memory device reads or write 128 bits of data over two ½ K pages. The 128 bits of data are spread over two pages, and the ECC data bits are also spread over the two pages, with each page storing 4 ECC bits. Thus, Page A includes 64 bits of data plus 4 bits allocated for internal ECC or ECC plus system bits. Page B also includes 64 bits of data plus 4 bits allocated for internal ECC or ECC plus system bits. In one embodiment, in the first option the memory device also stores and exchanges 4 additional system bits per 128 data bits. In alternative embodiments, other numbers of extra system bits can be used. The additional system bits can be stored with the ECC bits, or stored separately. Even if the ECC bits are spread across two pages, in one embodiment, the memory device can store the extra system bits in a single page or across the two pages. Data 320 represents 128 bits of data with associated 8 bits of ECC bits or ECC and extra system bits. While data 320 may be similar to data 310 with 128 bits of data and 8 ECC bits, data 320 is stored differently.

Figure 3C:
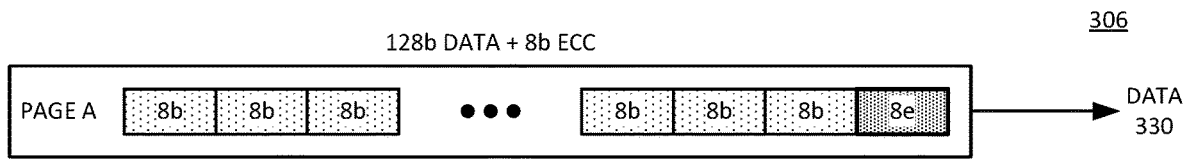
Figure 3D:
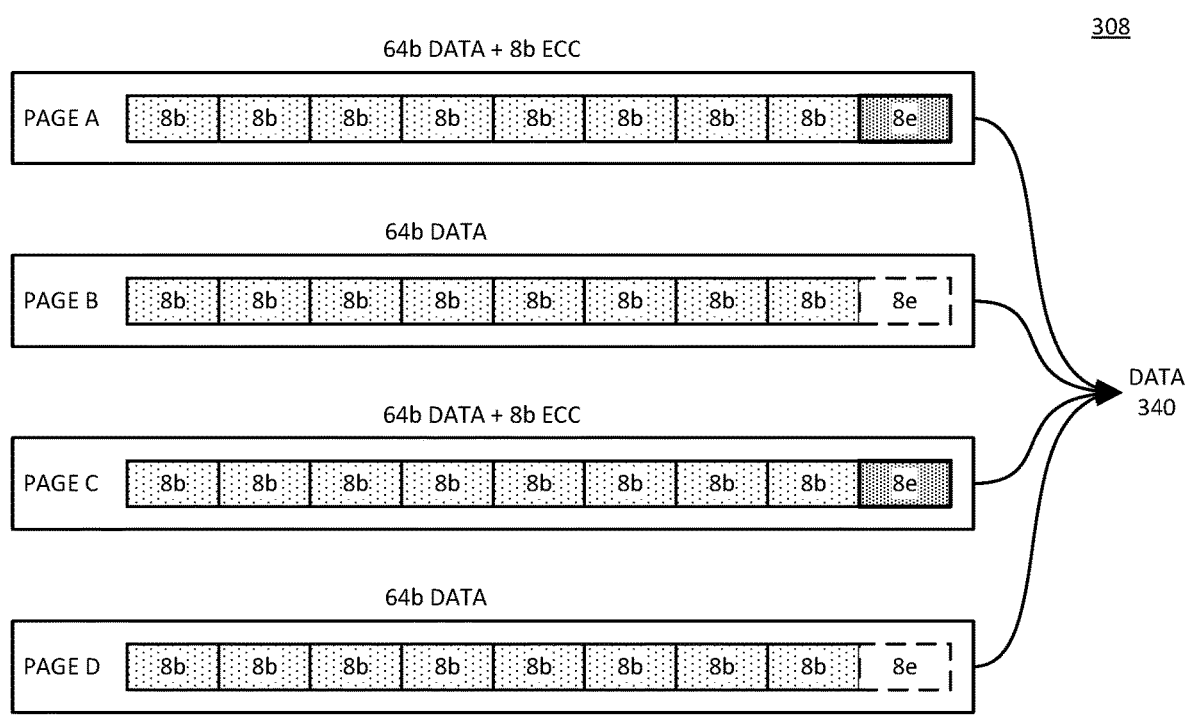
Figure 4A:
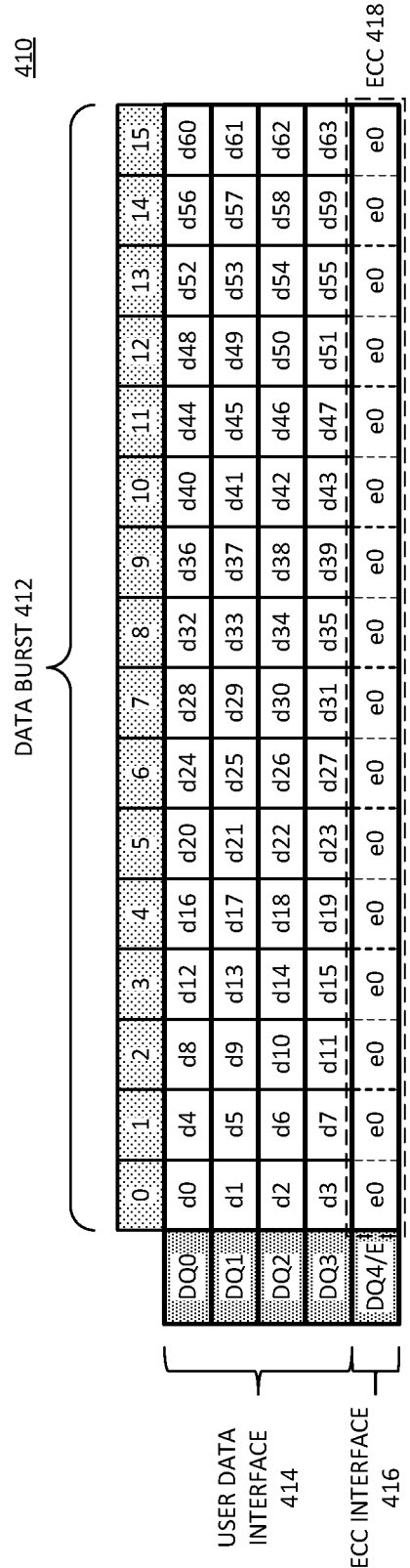
FIGS. 4A-4D are embodiments of tabular data that represent an exchange of error checking and correction bits between a host and a memory that exchanges extra system bits with error checking and correction information.
Figure 4B:
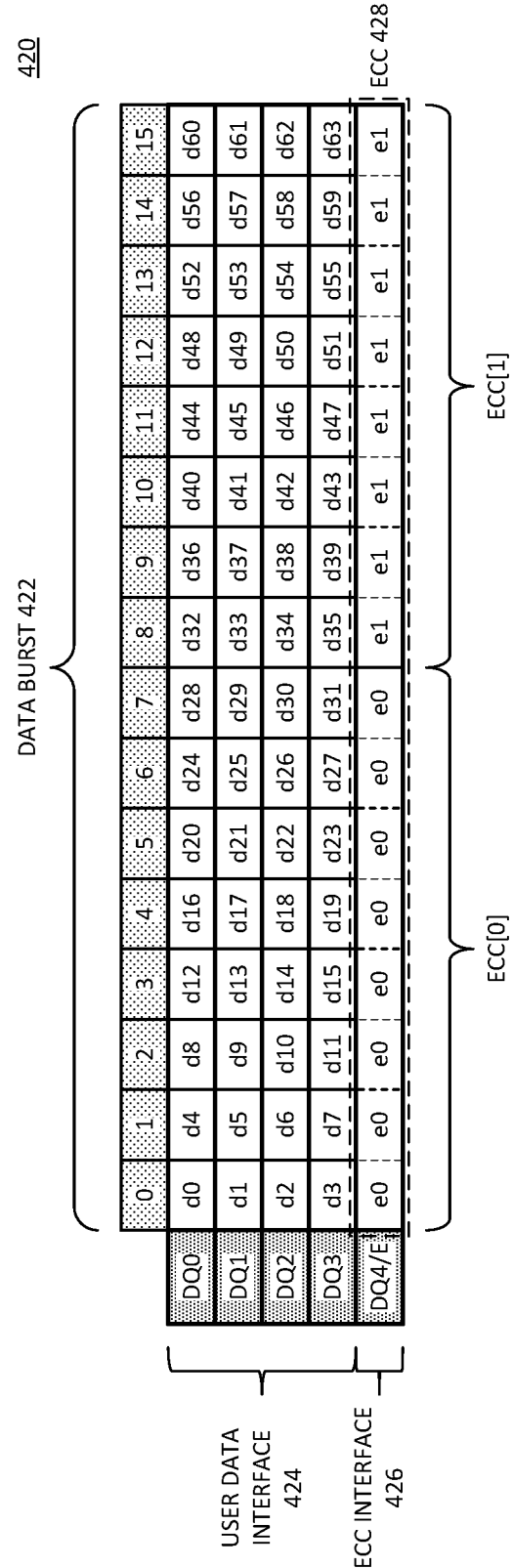
Figure 4C:
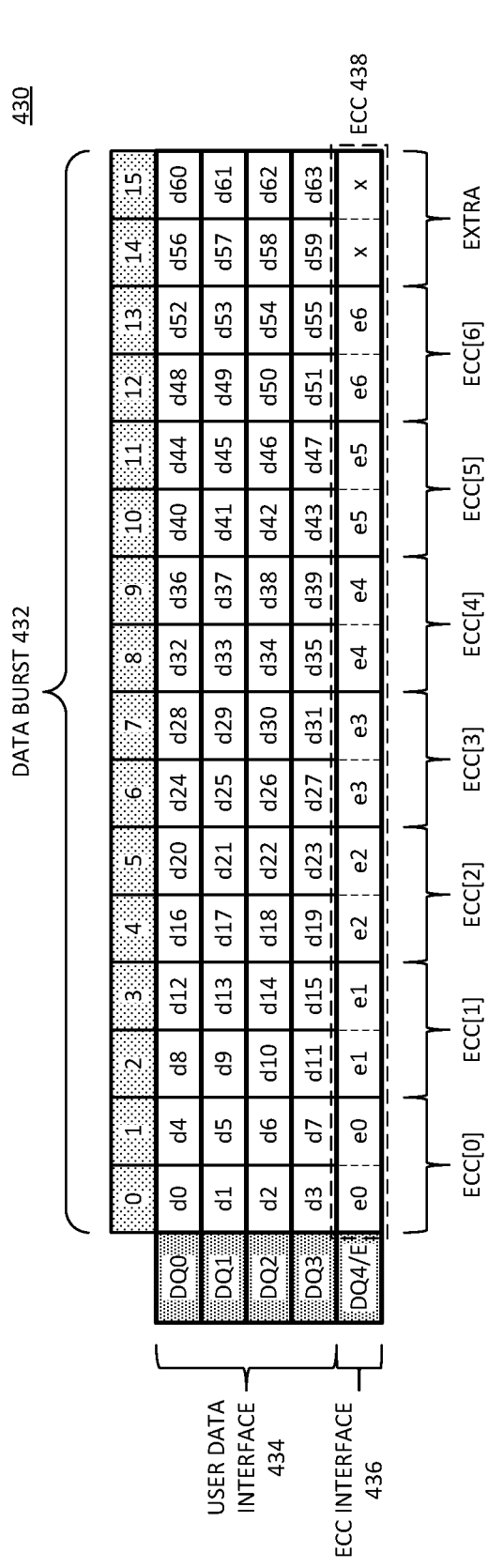
Figure 4D:
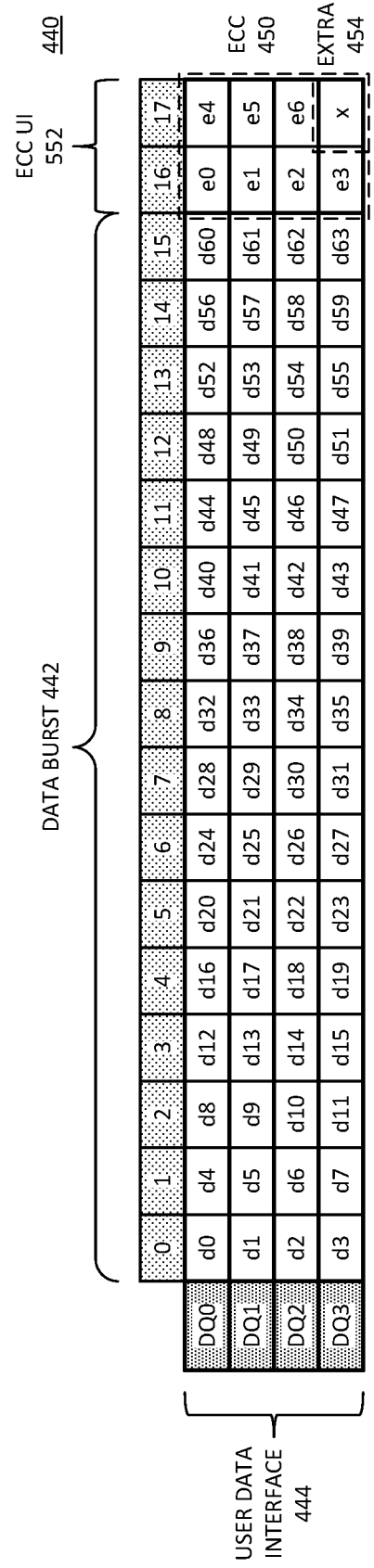

Referring to diagram 306 of FIG. 3C, the memory device stores all data bits and all ECC bits in a single page. Thus, Page A includes 128 bits of data plus 8 bits allocated to internal ECC or ECC plus system bits. In one embodiment, the memory device stores additional system bits with Page A. It will be understood that such an option would require additional access/prefetch circuitry, which would increase memory die size and consume more power. Data 330 represents 128 bits of data with associated 8 bits of ECC bits or ECC and extra system bits, all from a single page.

In diagram 308, there are a total of 256 bits from four pages, which may be in accordance with an embodiment described herein. Diagrams 302, 304, and 306 can be understood to be in accordance with diagram 308 in various embodiments. Diagram 308 illustrates one example of how 256 data bits and associated ECC and system bits can be allocated in accordance with diagram 302. Alternate embodiments of diagram 308 can be in accordance with diagram 304 or diagram 306. As illustrated, there are 8 memory locations for internal ECC and extra bits for each of 64 bits pages, and the memory device stores 8 ECC and extra bits in one page and 8 ECC and extra bits in another page, while two pages are not allocated memory space for ECC and extra bits. The memory device spreads the data across the four pages. Thus, Page A includes 64 bits of data plus 8 bits allocated for internal ECC or ECC plus system bits. Page B includes 64 bits of data, and no ECC bits. Page C includes 64 bits of data plus 8 bits allocated for internal ECC or ECC plus system bits. Page D includes 64 bits of data, and no ECC bits. The allocation of ECC bits among the pages can be provided in any manner, such as in Pages A and B, with none in Pages C and D, or another configuration. In one embodiment, the memory device stores extra system bits across Pages A and C with the internal ECC bits. Data 340 represents 256 bits of data with associated 16 bits of ECC and extra system bits.

Consider one embodiment of a memory device with a ×4 interface. In one embodiment, for a read, the memory device can prefetch data and transfer 128 bits to the memory controller with BL16 over two interfaces (4*2*16=128). In one embodiment, for a write, the memory controller can transfer the data to the memory device with BL16 in similar fashion. Extra system bits can be transferred either in a separate lane or in a separate UI. The data can be stored in accordance with any of diagrams 302, 304, 306, or 308, and similarly prefetched for reads.

FIGS. 4A-4D are embodiments of tabular data that represent an exchange of error checking and correction bits between a host and a memory that exchanges extra system bits with error checking and correction information. In accordance with what is described herein, extra bits can be provided by memory devices over an extended burst. As illustrated in diagram 410 of FIG. 4A, diagram 420 of FIG. 4B, and diagram 430 of FIG. 4C, the memory device can provide one or more additional bits over an extra lane or extra data signal line. Such a signal line can be routed from the memory device to a controller on a memory module, or coupled to logic circuits on a memory module to interface with the associated memory controller. For example, if multiple memory devices provide one or more bits of data over an additional signal line, the lines may be multiplexed and selected to provide the appropriate data to the memory controller. As illustrated in diagram 440 of FIG. 4D, the memory device can alternatively provide one or more additional bits in a UI of one of the standard signal lines of the data interface, which can be referred to as transmitting inline. The inline transmission occurs on an additional UI or extra burst cycle. In an embodiment where different memory devices in parallel transmit one of the multiple bits, each device could transmit its allocated extra bit only in the UI and signal line assigned to it. In one embodiment, multiplexing logic can select the appropriate signal to send to the memory controller.

Referring to diagram 410, user data interface 414 illustrates DQ[3:0], which represent the 4 lanes of a ×4 interface memory device or DRAM. It will be understood that a different interface size could be used. As illustrated, the DRAM operates on a data burst 412 of BL16, to transfer 64 bits over user data interface 414. In one embodiment, the DRAM also transfers on a fifth signal line or fifth data lane ECC interface 416, which provides an extra system bit. The extra system bit is illustrated as e0. In one embodiment, the additional signal line, DQ4/E operates on a slower transfer speed than DQ[3:0]. Thus, the system could require 16 DQ UI for a single bit transfer for e0 over the extra data lane. In one embodiment, DQ4/E has the same speed interface as DQ[3:0], and simply repeats the transfer for multiple UI to transfer e0.

Referring to diagram 420, user data interface 424 illustrates DQ[3:0], which represent the 4 lanes of a ×4 interface memory device or DRAM. It will be understood that a different interface size could be used. As illustrated, the DRAM operates on a data burst 422 of BL16, to transfer 64 bits over user data interface 424. In one embodiment, the DRAM also transfers on a fifth signal line or fifth data lane ECC interface 426, which provides extra system bits. The extra system bits are illustrated as e0 and e1. In one embodiment, the additional signal line, DQ4/E operates on a slower transfer speed than DQ[3:0]. Thus, the system could require 8 DQ UI for a single extra bit transfer over the extra data lane. In one embodiment, DQ4/E has the same speed interface as DQ[3:0], and simply repeats the transfer for multiple UI to transfer e0 and e1. In one embodiment, if more than one extra bit is assigned per 64 bits of data, the memory device and memory controller can exchange the extra bits as follows: e0 during UI[0:7] on DQ4/E, and e1 during UI[8:15] on DQ4/E.

Referring to diagram 430, user data interface 434 illustrates DQ[3:0], which represent the 4 lanes of a ×4 interface memory device or DRAM. It will be understood that a different interface size could be used. As illustrated, the DRAM operates on a data burst 432 of BL16, to transfer 64 bits over user data interface 434. In one embodiment, the DRAM also transfers on a fifth signal line or fifth data lane ECC interface 436, which provides extra system bits. The extra system bits are illustrated as e[0:6]. In one embodiment, the additional signal line, DQ4/E operates on a slower transfer speed than DQ[3:0]. Thus, the system could require 2 DQ UI for a single extra bit transfer over the extra data lane. In one embodiment, DQ4/E has the same speed interface as DQ[3:0], and simply repeats the transfer for multiple UI to transfer the extra bits. In one embodiment, the memory device and memory controller can exchange the extra bits as follows: e0 during UI[0:1] on DQ4/E, e1 during UI[2:3] on DQ4/E, e2 during UI[4:5] on DQ4/E, e3 during UI[6:7] on DQ4/E, e4 during UI[8:9] on DQ4/E, e5 during UI[10:11] on DQ4/E, and e6 during UI[12:13] on DQ4/E. It will be observed that no extra bit is shown transferred on UI[14:15], referring to an embodiment where only 7 extra bits are available. In an alternate embodiment, the memory device and memory controller can exchange data on DQ4/E during UI[14:15].

Referring to diagram 440, user data interface 444 illustrates DQ[3:0], which represent the 4 lanes of a ×4 interface memory device or DRAM. It will be understood that a different interface size could be used. In contrast to diagrams 410, 420, and 430 described above, which illustrate an additional lane for transferring extra bits, in diagram 440 the memory device and memory controller can exchange extra bits on additional UIs. As illustrated, the DRAM operates on a data burst 442 of BL18 for ECC transactions. In one embodiment, the memory device may be configured to transfer over BL16 for non-ECC transactions, and configured to transfer over BL18 for ECC-based transactions. As illustrated, UI[16] and UI[17] are identified as ECC UIs 552, because they are additional transfer cycles on which extra bits can be transferred. In one embodiment, only 7 extra bits are available, and so there is no e7. Thus, UI[17] may have extra slot 454 where no bit is transferred on DQ3. In an alternate embodiment, the memory device and memory controller can exchange data on DQ3 during UI[17].

In general for FIGS. 4A-4D, the representations of the transmission of one or more extra bits can be applied by one or more memory devices of a group. In one embodiment, a memory controller connects to multiple memory devices in parallel, such as the memory devices of a DIMM. When multiple memory devices are coupled in parallel, in one embodiment, one or more of the memory devices provides extra bits on one or more additional UIs, and one or more other memory devices does not. For example, consider the example provided above of a memory subsystem with 9 DRAM devices and a 40 bit channel or an interface that provides data over 40 signal lines. Nine DRAM devices that have ×4 interfaces equals 36 signal lines for data and single bit error ECC data, leaving 4 signal lines for additional data. In one embodiment, one or more memory devices couple to the additional signal lines. If fewer than 4 device coupled to the lines, the signal lines could be multiplexed to one or more signal lines of the memory devices. In one embodiment, where 9 DRAM devices are used, 5 devices can provide ×4 interfaces (20 bits) plus another 4 devices that provide ×5 interfaces (20 bits) such as those illustrated in FIGS. 4A-4C. Alternatively, additional data transfer UIs could be used, or additional UI data transfers from the DRAM devices could be buffered (for example in a DIMM register) and transmitted over 40 signal lines. It will be understood that these examples are merely for illustration and are not limiting.

Figure 5A:
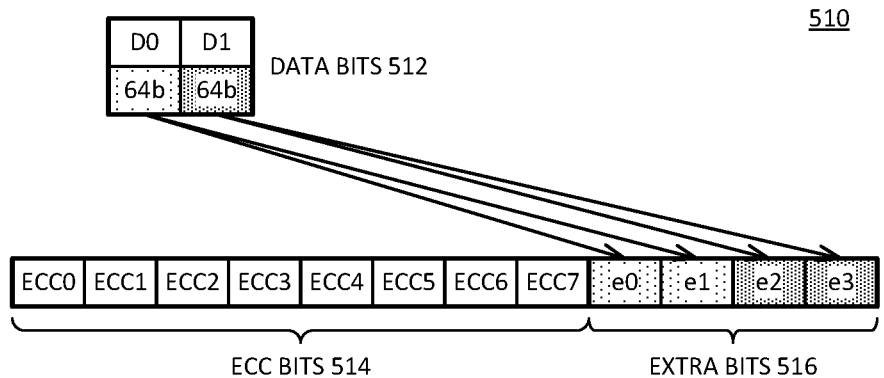
FIGS. 5A-5C are block diagrams of embodiments of mapping extra system bits to memory.
Figure 5B:
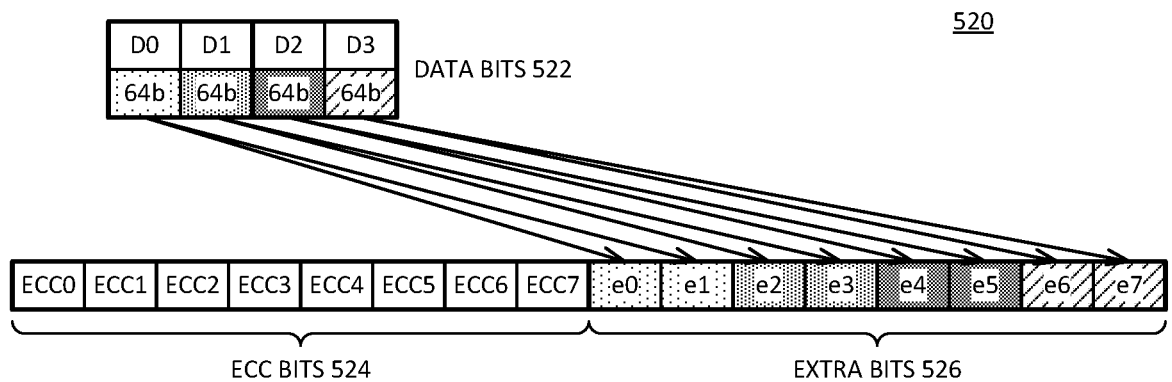
Figure 5C:
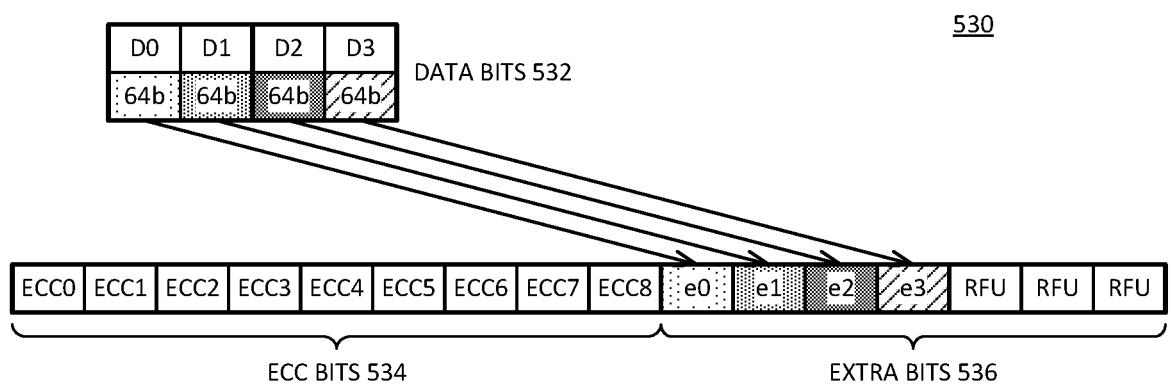

FIGS. 5A-5C are block diagrams of embodiments of mapping extra system bits to memory bits. Referring to mapping 510 of FIG. 5A, 128 bits of data can include 64 bits from two separate sources or from a single page. In one embodiment, D0 and D1 represent separate memory devices or memory dies that exchange a chunk of the overall data. In one embodiment, 4 extra system bits 516 can be added per 128 data bits 512 (e.g., two bits to each of two pages), in addition to ECC bits 514. Thus, the number of ECC and system bits can be 8 ECC bits per 128 data bits, with 4 extra bits provided by different devices. With the additional system bits, there may be 12 bits per 128 data bits, with 8 ECC bits and 4 extra bits. Mapping 510 provides an example of a mapping for two devices, and additional devices can be added, some of which may not map to extra bits, and some of which may map to extra bits that are not shown.

Referring to mapping 520 of FIG. 5B, four ×4 devices have four 64b chunks for 256b of data. D[0:4] include 256 bits of data, each having 64 bits from four separate sources or from one or multiple pages. In one embodiment, 8 extra system bits 526 can be added per 256 data bits 522, in addition to ECC bits 524. Thus, the number of ECC and system bits can be 8 ECC bits for data bits, with up to 8 extra bits. With the additional system bits, there may be 16 bits per 256 data bits, with 8 ECC bits and 8 extra bits. In one embodiment, one or more of bits 526 shown as extra bits is an additional ECC bit.

Referring to mapping 530 of FIG. 5C, four ×4 devices have four 64b chunks for 256b of data. D[0:4] include 256 bits of data, each having 64 bits from four separate sources or from one or multiple pages. In one embodiment, 7 extra system bits 536 can be added per 256 data bits 532, in addition to ECC bits 534. Thus, the number of ECC and system bits can be 9 ECC bits for the 256 data bits, with up to 7 extra bits. With the additional system bits, there may be 16 bits per 256 data bits, with 9 ECC bits 534 and 7 extra bits 536. Mapping 530 can be considered a more specific case of mapping 520, where one of extra bits 526 provides the ninth ECC bit ECC8. In one embodiment, not all extra bits are used. For example, mapping 530 illustrates e[0:3] associated, respectively, with D[0:3], and three extra bits being reserved (RFU, or reserved for future use). In one embodiment, the various memory devices provide one extra bit per 64 bit chunk. In an alternative embodiment, alternating between transferring one and two additional bits per page of data can use up all 7 extra bits. In one embodiment, D[0:3] represent only the memory devices that map to extra bits and will exchange extra bits with the memory controller. Other memory devices will provide the remaining data bits for a page, and an additional device can provide the ECC bits. In such a case where an additional memory device provides the ECC bits, it will be understood that ECC8 can be provided as an extra bit, either from one or more of the data memory devices, or from the ECC memory device.

FIG. 6A is a block diagram of an embodiment of a system with a register for DRAM devices that provide extra system bits for system ECC in accordance with any embodiment described herein. System 602 illustrates one embodiment of a system with memory devices that share a control bus (C/A (command/address) bus 612) and a data bus (data bus 614). The shared C/A bus can be shared among DRAM devices 620 on the same channel. As illustrated, system 602 includes two channels, and thus includes C/A bus 612[0] and C/A bus 612[1]. Similarly, system 602 includes data bus 614[0] and data bus 614[1]. DRAM devices 620 can be individually accessed with device specific commands, and can be accessed in parallel with parallel commands. In one embodiment, DRAM devices 620 represent memory devices on a DIMM. It will be understood that different implementations can have different numbers of DRAM devices (either more or fewer).

Register 610 represents a controller for system 602, or a controller for a memory module or DIMM represented by system 602. It will be understood that the controller represented by register 610 is different from a host controller or memory controller (not specifically shown) of a computing device in which system 602 is incorporated. Likewise, the controller of register 610 is different from an on-chip or on-die controller that is included on the DRAM devices 620. In one embodiment, register 610 is a registered clock driver (which can also be referred to as a registering clock driver). The registered clock driver receives information from the host (such as a memory controller) and buffers the signals from the host to the various DRAM devices 620. If all DRAM devices 620 were directly connected to host 630, the loading on the signal lines would degrade high speed signaling capability. By buffering the input signals from the host, host 630 only sees the load of register 610, which can then control the timing and signaling to the DRAM devices 620. In one embodiment, register 610 is a controller on a DIMM to control signaling to the various memory devices.

Register 610 includes interface circuitry to couple to host 630 and to DRAM devices 620. While not shown in specific detail, the hardware interface can include drivers, impedance termination circuitry, and logic to control operation of the drivers and impedance termination. The interfaces can include circuitry such as interfaces described below with respect to an interface between a DRAM device and a memory controller of host 630. The interface circuitry can provide interfaces to various buses described with respect to system 100.

The interface circuitry enables coupling to DRAM devices 620 over data bus 614. In one embodiment, the interface circuitry enables coupling to DRAM devices 620 over C/A bus 612. In one embodiment, register 610 has independent command ports for separate channels. In one embodiment, register 610 has independent data ports for separate channels. Separate and independent channels, channel 0 and channel 1, can enable the parallel communication of data on two different data buses 614[0] and 614[1], which can collectively be referred to as data buses 614. In one embodiment, all memory devices 620 in system 602 share the same data bus 614. Separate channels can enable the parallel communication of commands on two different command buses 612[0] and 612[1], which can collectively be referred to as C/A buses 612. In one embodiment, all memory devices 620 in system 602 share the same C/A bus. In one embodiment, memory devices 620 are coupled to parallel C/A buses 612 and data buses 614 for purposes of signaling and loading. While two channels are illustrated, in one embodiment, more channels can be provided in system 602. While not specifically shown, in addition to being coupled to host 630, system 602 can include a connection to nonvolatile storage (not shown).

In one embodiment, host 630 provides commands and address information through a C/A bus connection to register 610 (not specifically shown). In one embodiment, host 630 directly couples to DRAM devices 620 through C/A buses 612. In one embodiment, register 610 functions as a C/A register, and register 610 can forward commands from the host to the DRAM devices. C/A buses 612 are typically unilateral buses to carry command and address information to all DRAM devices in a channel. Thus, the bus can be a multi-drop bus.

In response to one or more memory access commands on the C/A bus, DRAM devices 620 execute operations requested, which can include writing data or reading data. For a write, host 630 provides the data to write to the specified address over data bus 614. In system 602, multiple DRAM devices 620 in parallel on a channel will write a portion of the read data. For example, the DRAM devices may have a x4 or x8 interface, and write the number of bits per transfer cycle of a burst length in accordance with the interface. For a read, DRAM devices 620 provide the data to host 630 over data bus 614. In one embodiment, system 602 includes a common bidirectional data bus 614, where register 610 can connect to each DRAM device with a number of bits equal to the interface width, with a matched strobe pair. In one embodiment, data buses 614 are terminated at either end of the bus segment to avoid signal reflections.

When ECC is applied in system 602, data buses 614 enable the exchange of both user data and ECC check bits. As illustrated, data 632 represents the user data and ECC bits 634 represent the check bits to protect data 632. In accordance with what is described herein, in one embodiment, data buses 614 enable the providing of extra bits 636, which represent bits sent in UIs that can be used for ECC bits. Internally, DRAM devices 620 can exchange extra bits 636 based on an allocation of bits or memory spaces for internal ECC which is in excess of what is needed for the number of ECC bits used to provide internal ECC for the number of data bits stored in the DRAM devices. The number of data bits stored and fetched for memory operations can be in excess of the number of data bits each DRAM device 620 will contribute data 632. For example, DRAM devices 620 may operate on 256 bits of data internally, with 9 internal check bits used for ECC, and each device will contribute a 64 bit chunk to each memory access operation (either by storing 64 bits for a write or outputting 64 bits for a read). As one specific example, if SEC is the level of ECC applied, a certain number of internal check bits separate from ECC bits 634 will be required to perform SEC within the DRAM devices. DRAM devices 620 can provide unused, allocated ECC address space for additional system bits represented by extra bits 636. Extra bits 636 can enable host 630 to provide ECC protection beyond SEC, such as enabling recovery from a whole device failure.

For example, in one embodiment, DRAM devices 620 provide for 2N memory locations for internal ECC bits. If only N+1 check bits are needed for ECC, there are 2N minus (N+1) slots theoretically available for additional information. Host 630 and DRAM devices 620 exchange extra bits 636 for the DRAM devices to store and then provide the extra bits.

System 602 illustrates register 610 and DRAM devices 620 in a configuration similar to a DIMM layout. However, in one embodiment, register 610 can represent or be replaced with other hardware interface logic to couple a multi-device package of memory to host 630. For example, certain multichip packages can include multiple DRAM dies within the device package. The DRAM dies can be stacked, or otherwise packaged together. In one embodiment, such a package includes a high bandwidth memory device. In a multichip package implementation, the application of ECC can be provided in accordance with what is described herein.

Figure 6B:
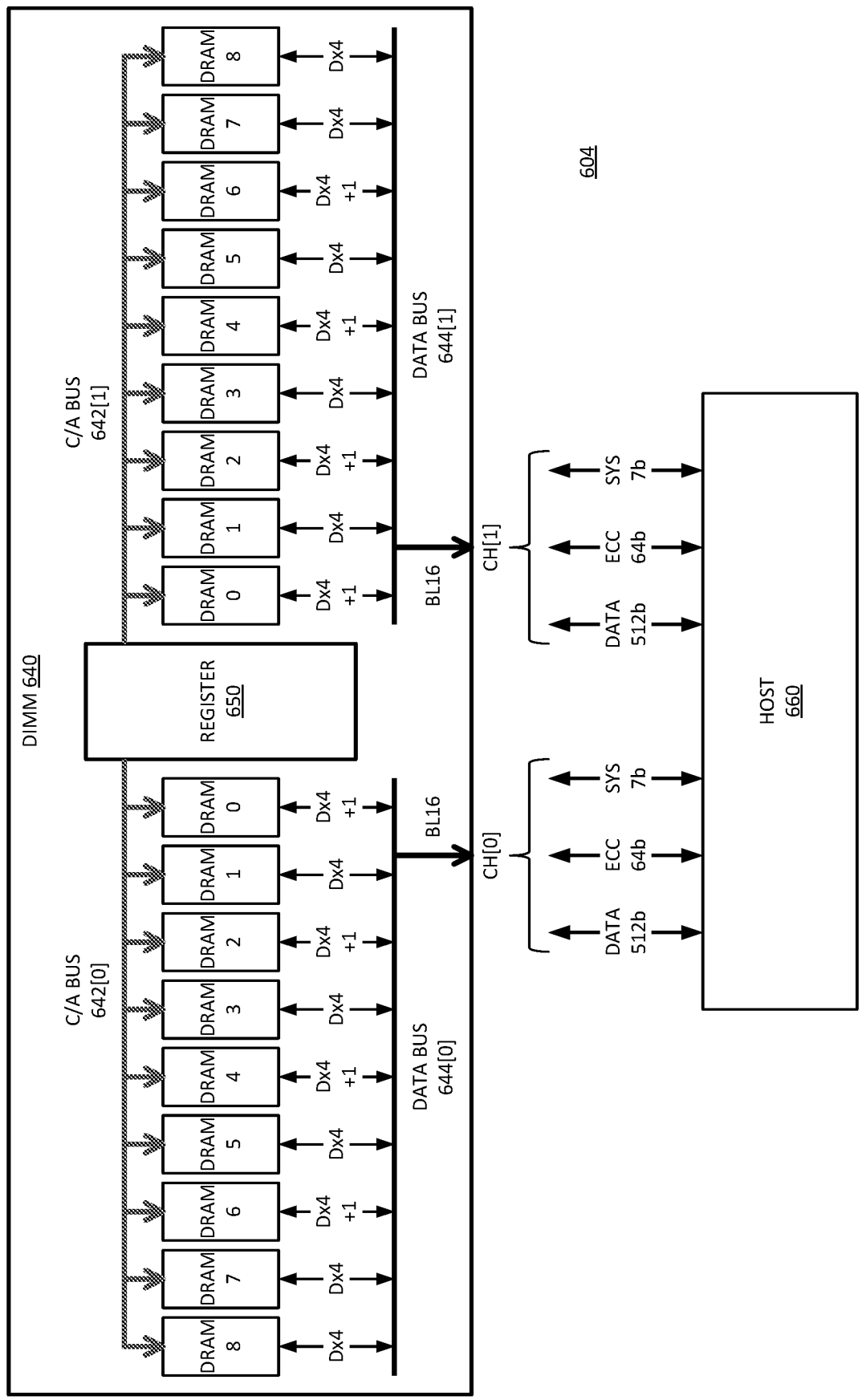
FIG. 6B is a block diagram of an embodiment of a DIMM with x4 DRAM devices that provide extra system bits for system ECC over a longer burst length.

FIG. 6B is a block diagram of an embodiment of a DIMM with x4 DRAM devices that provide extra system bits for system ECC over a longer burst length. System 604 provides one example of a DIMM system in accordance with system 602 of FIG. 6A. More specifically, system 604 illustrates an embodiment of DIMM 640, with two channels of DRAM devices. Each channel includes 9 DRAM devices, DRAM [0:8], which have x4 data bus interfaces.

Host 660 provides a command to either channel 0, CH[0], or channel 1, CH[1] over a command and address bus (not specifically shown). In one embodiment, the C/A bus goes through register 650 on DIMM 640, and commands are forwarded to the DRAM devices over C/A buses 642, with C/A bus 642[0] for CH[0], and C/A bus 642[1] for CH[1]. Data for read and write transactions is exchanged over data buses 644, with data bus 644[0] for CH[0], and data bus 644[1] for CH[1]. In one embodiment, a multiple DRAM devices provide one extra bit per 64b chunk of data. As illustrated, DRAM[0], DRAM[2], DRAM[4], and DRAM[6] per channel provide an additional bit, and are illustrated as being Dx4+1, or a x4 interface for data, plus one additional signal line to transfer an extra bit. It will be understood that the implementation illustrated is merely one example, and any different DRAM device can be selected to provide an additional bit. In one embodiment, register 650 can select a DRAM device to provide the extra bit, and those choose a DRAM device to select the extra bit based on an LSB (least significant bit) of a CAS (column address strobe) command. In response to such a command, the DRAM device selected for providing the extra bit can drive the bit on the interface for read and read the bit from the interface for write.

As illustrated in system 604, data buses 644 have a burst of BL16, in one embodiment. In one embodiment, with BL16 and 9 DRAM devices where 5 devices have ×4 interfaces and 4 devices have ×5 interfaces, the channel can have a physical bandwidth of 40 bits or signal lines, times 16 transfer cycles can provide up to 640 data bits. In one embodiment, all ×4 interfaces transfer data for the entire BL16 cycle for 36*16=576 bits, and each of the additional interfaces selectively drives either 1 or two extra bits. The 576 bits are the 512 data bits plus the 64 system ECC bits. System 604 illustrates 7 system bits, which totals 583 bits exchanged, and the 7 system bits are exchanged over one or more of the additional interface signal lines over the 16 transfer cycles. In one embodiment, the DRAM devices illustrated as D×4 have a fifth interface signal line, and could be configured as D×4+1, but the additional interface signal line is not connected.

Figure 7:
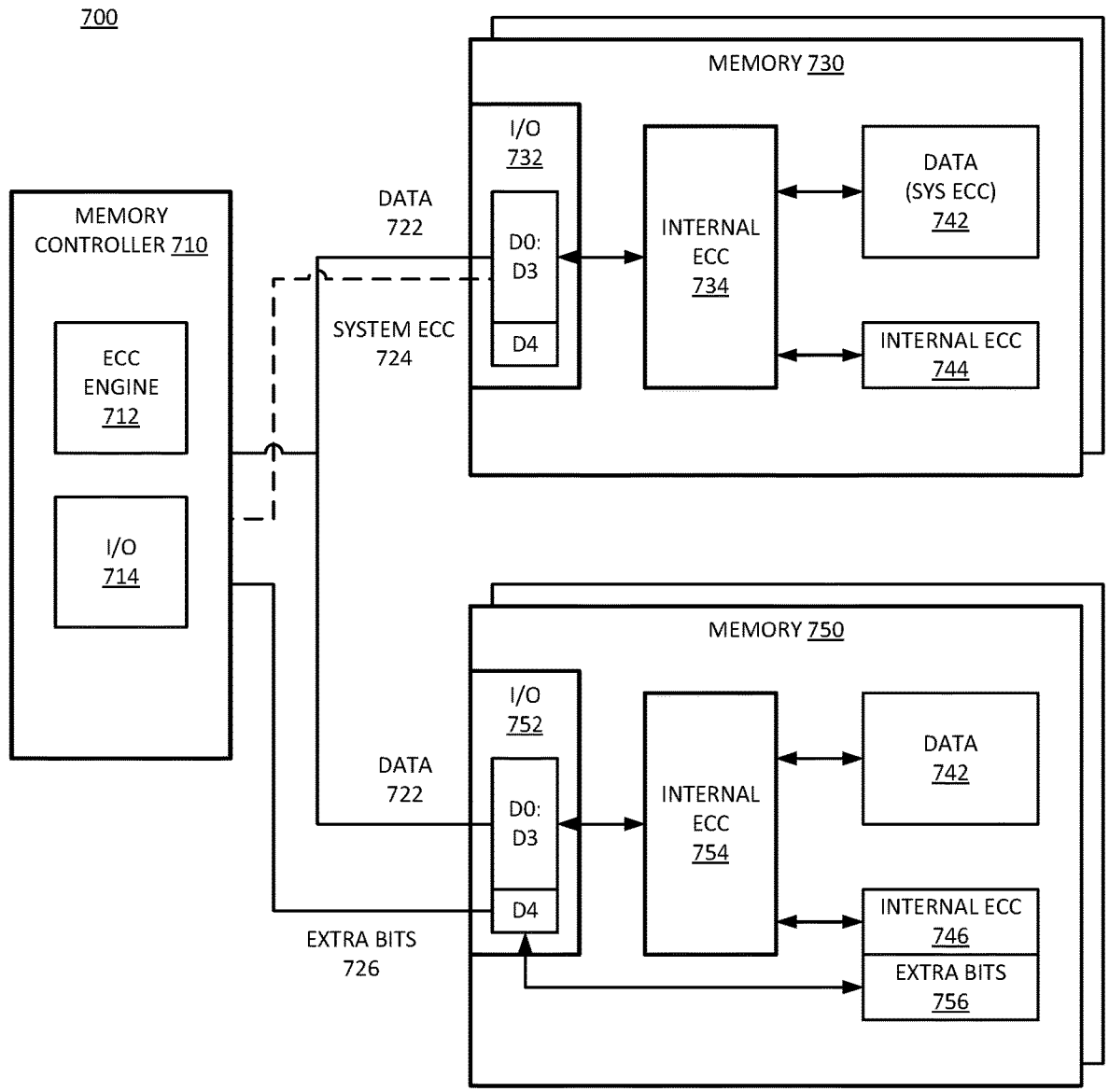
FIG. 7 is a block diagram of an embodiment of a system in which a memory device and memory controller exchange extra bits with a data access transaction.

FIG. 7 is a block diagram of an embodiment of a system in which a memory device and memory controller exchange extra bits with a data access transaction. System 700 provides an example of a system in accordance with an embodiment of system 604 of FIG. 6B. Memory controller 710 represents a control circuit of the host to provide management of memory access to memory devices 730 and 750. Memory controller 710 is illustrated to include ECC engine 712, which represents logic including circuitry to perform ECC functions for system 700. I/O 714 represents the hardware interface elements and software control logic to drive the hardware to exchange or send and receive data with memory devices 730 and 750.

Memory devices 730 are illustrated with I/O 732, which represents hardware interface elements and software control logic to drive the hardware to exchange data with memory controller 710. Similarly, memory devices 760 are illustrated with I/O 752, which represents hardware interface elements and software control logic to drive the hardware to exchange data with memory controller 710. As illustrated, both memory devices 730 and memory devices 750 include hardware interfaces to four data bus signal lines. Each device has D[0:3], which will connect to different signal lines of a total data bus.

In one embodiment, memory controller 710 is capable of coupling to memory 730 and memory 750 in parallel via a data bus, which can exchange data 722 and system ECC 724. In one embodiment, memory controller can exchange extra bits 726 with selected memory devices, and specifically with memory devices 750. In one embodiment, memory devices 730 include interface D[4], but it is not connected, and only D[0:3] are connected for the exchange of data 722 and system ECC 724. In one embodiment, memory devices 750 are connected for the exchange of data 722 and system ECC 724 with D[0:3], and also include D[4] connected for the exchange of extra bits 726, in accordance with any embodiment described herein.

As a specific example, consider that memory controller 710 exchanges 512 data bits 722 with 64 system ECC bits 724, and either 4 or 7 extra bits 726. In one embodiment, each of four memory devices 730 exchanges 64 data bits, and a fifth memory device 730 exchanges the 64 ECC bits.

In one embodiment, upon receiving data for write through I/O 732, memory devices 730 perform internal ECC operations with internal ECC 734, which generates internal check bits. Thus, memory devices 730 store data 742, which may be the system ECC bits for the ECC device in one embodiment, and internal ECC bits 744 generated by and for use by internal ECC 734. For read, internal ECC 734 reads internal ECC bits 744 and applies ECC operations before sending the data to memory controller 710.

Continuing with the example, in one embodiment, each of four memory devices 750 exchanges 64 data bits, and exchanges extra bits 726. In one embodiment, each memory device 750 contributes one extra system bit for 4 extra bits 726. In one embodiment, memory devices 750 each contribute at least one extra system bit, and alternately contribute 2 extra system bits for a total of 7 extra bits 726. Other numbers of extra bits can be used, including more than 7 extra bits in alternative embodiments. The storage of extra bits can be in accordance with any embodiment described herein, which allows for more than 7 extra system bits to be stored. The transfer of extra bits can be in accordance with any embodiment described herein, which allows for more than 7 extra system bits to be exchanged. In one embodiment, upon receiving data for write through I/O 752, memory devices 760 perform internal ECC operations with internal ECC 754, which generates internal check bits. Thus, memory devices 750 store data 742 and internal ECC bits 746 generated by and for use by internal ECC 754. For read, internal ECC 754 reads internal ECC bits 746 and applies ECC operations before sending the data to memory controller 710.

Figure 8:
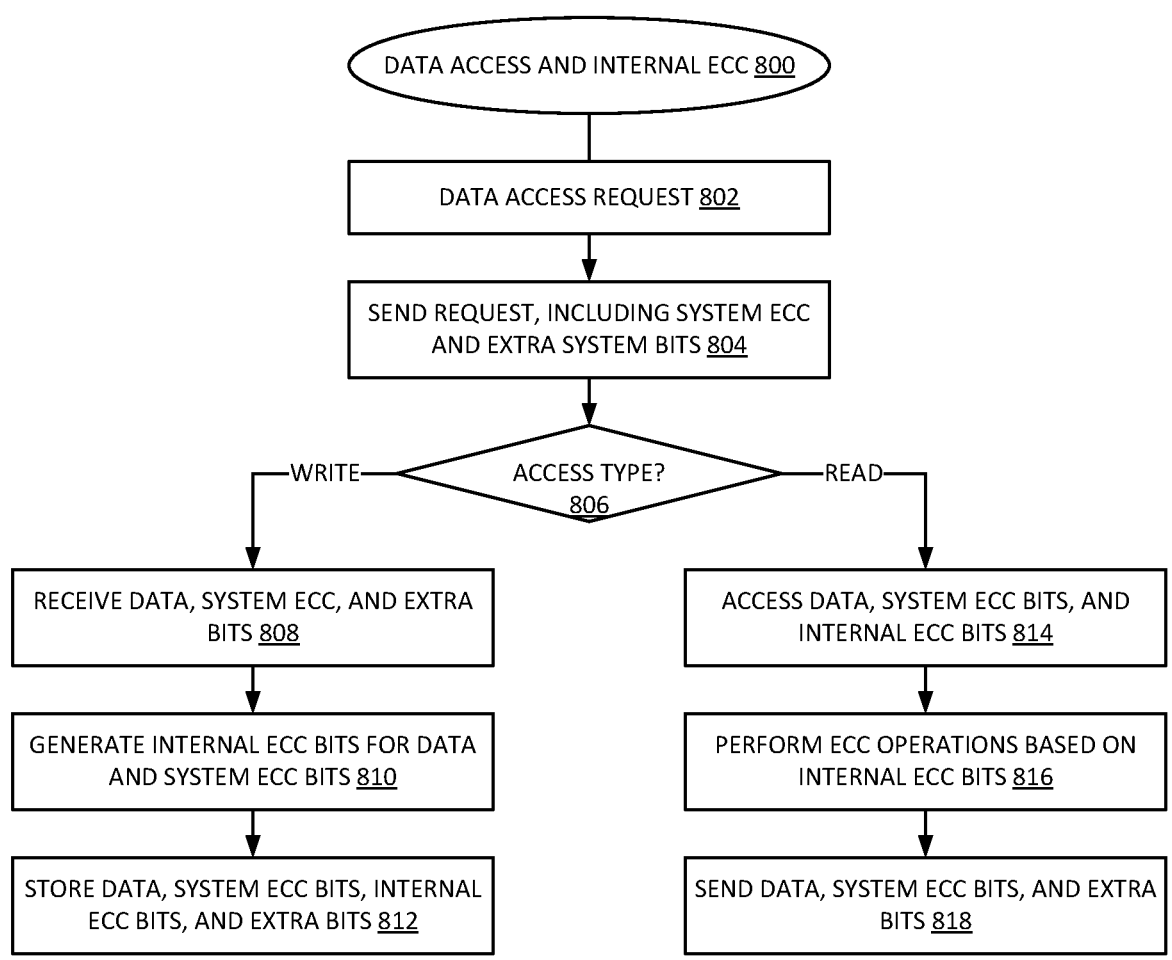
FIG. 8 is a flow diagram of an embodiment of a process for applying on-memory error checking and correction with extra system bits.

FIG. 8 is a flow diagram of an embodiment of a process for applying on-memory error checking and correction with extra system bits. Process 800 illustrates a flow for data access and internal ECC with extra system bits. Process 800 provides one example of a flow in accordance with any internal ECC architecture with extra system bits. Process 800 provides an example of an implementation of providing extra system bits with additional UIs in accordance with what is described herein.

The process illustrated can be a process performed by a memory subsystem in accordance with any embodiment described herein. More specifically, process 800 illustrates operations for a memory controller and associated memory device. The system generates a data access request, such as a read or write request, 802. In one embodiment, the memory controller sends the request for data access, including system ECC bits and extra system bits to accompany the access request, 804.

For a write access type corresponding to a write request, 806 WRITE branch, in one embodiment, the memory controller sends extra system bits with the write data and system ECC bits, which the memory device receives, 808. In one embodiment, the memory device generates internal ECC bits for the write data and system ECC bits, 810, and applies the extra system bits in accordance with a configuration of the memory device. In one embodiment, the memory device generates internal ECC bits for both the write data and system ECC bits, and not the extra system bits. In one embodiment, the memory device performs internal ECC on the extra system bits. The memory device stores the write data and the ECC bits, 812. In one embodiment, the memory device also stores the internal ECC bits and extra system bits in accordance with an embodiment of bit mappings as described herein, or a different mapping of ECC bits or extra system bits.

For a read access type corresponding to a read request, 806 READ branch, in one embodiment, the memory device fetches the read data and system ECC bits, and the internal ECC bits associated with the data, 814. In one embodiment, the memory device performs internal ECC on the data with internal check bits, 816. The memory device returns the data to the memory controller, which can include system ECC bits and extra system bits, 818.

Figure 9:
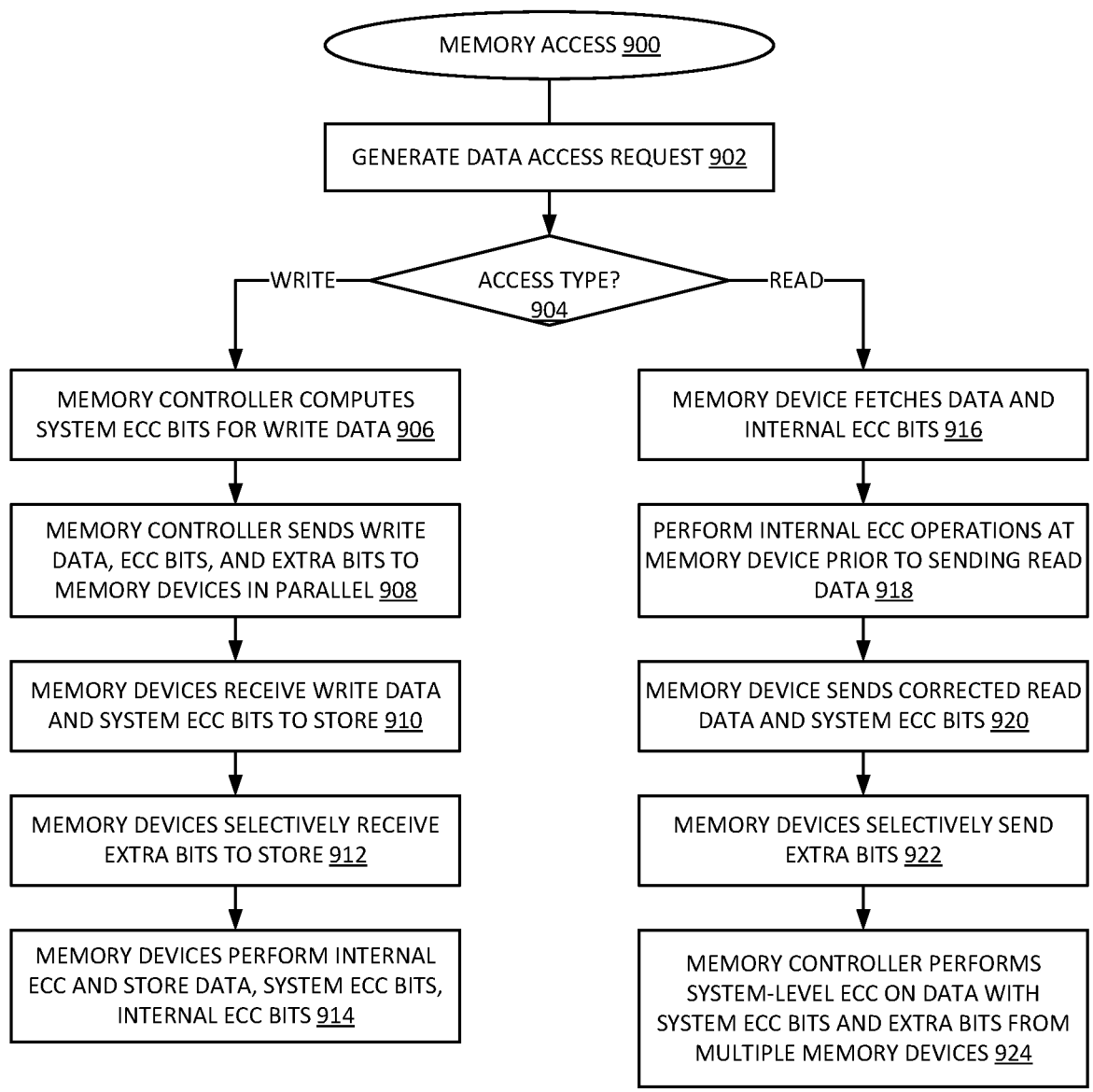
FIG. 9 is a flow diagram of an embodiment of a process for providing extra system bits for error checking and correction.

FIG. 9 is a flow diagram of an embodiment of a process for providing extra system bits for error checking and correction. Process 900 illustrates a flow for data access to multiple parallel memory devices. Process 900 provides one example of a flow in accordance with an implementation of providing extra system bits with additional UIs in accordance with what is described herein. In one embodiment, process 900 implements process 800 for each memory device.

The process illustrated can be a process performed by a memory subsystem in accordance with any embodiment described herein. More specifically, process 900 illustrates operations for a memory controller and associated memory device. The system generates a data access request, such as a read or write request, 902.

For a write request, 904 WRITE branch, the memory controller computes ECC check bits to send with the write data, 906. The memory controller sends the write data and associated system ECC bits to multiple memory devices in parallel, 908, such as to a memory module or multichip device. In one embodiment, the memory controller sends extra system bits to a selected one or more of the parallel memory devices. The memory devices receive the write data and associated system ECC bits to store, 910. In one embodiment, the memory devices perform internal ECC and store the data, the system ECC bits, and the internal ECC bits, 912. In one embodiment, the memory devices perform internal ECC and store the data, system ECC bits, and internal ECC bits and extra system bits, 914.

For a read request, 904 READ branch, in one embodiment, the memory device fetches the data, which can include system ECC bits, and associated internal ECC bits, 916. In one embodiment, the memory device performs internal ECC operations prior to sending the read data, 918, which can correct errors in the data prior to sending it to the memory controller. In one embodiment, the memory device sends the checked/corrected read data and associated system ECC bits to the memory controller, 920. One or more of the memory device can also send one or more extra system bits in accordance with what is described herein, 922. In one embodiment, the memory controller performs system level ECC with the system ECC bits and read data from multiple memory devices, including extra system bits, 924.

Figure 10:
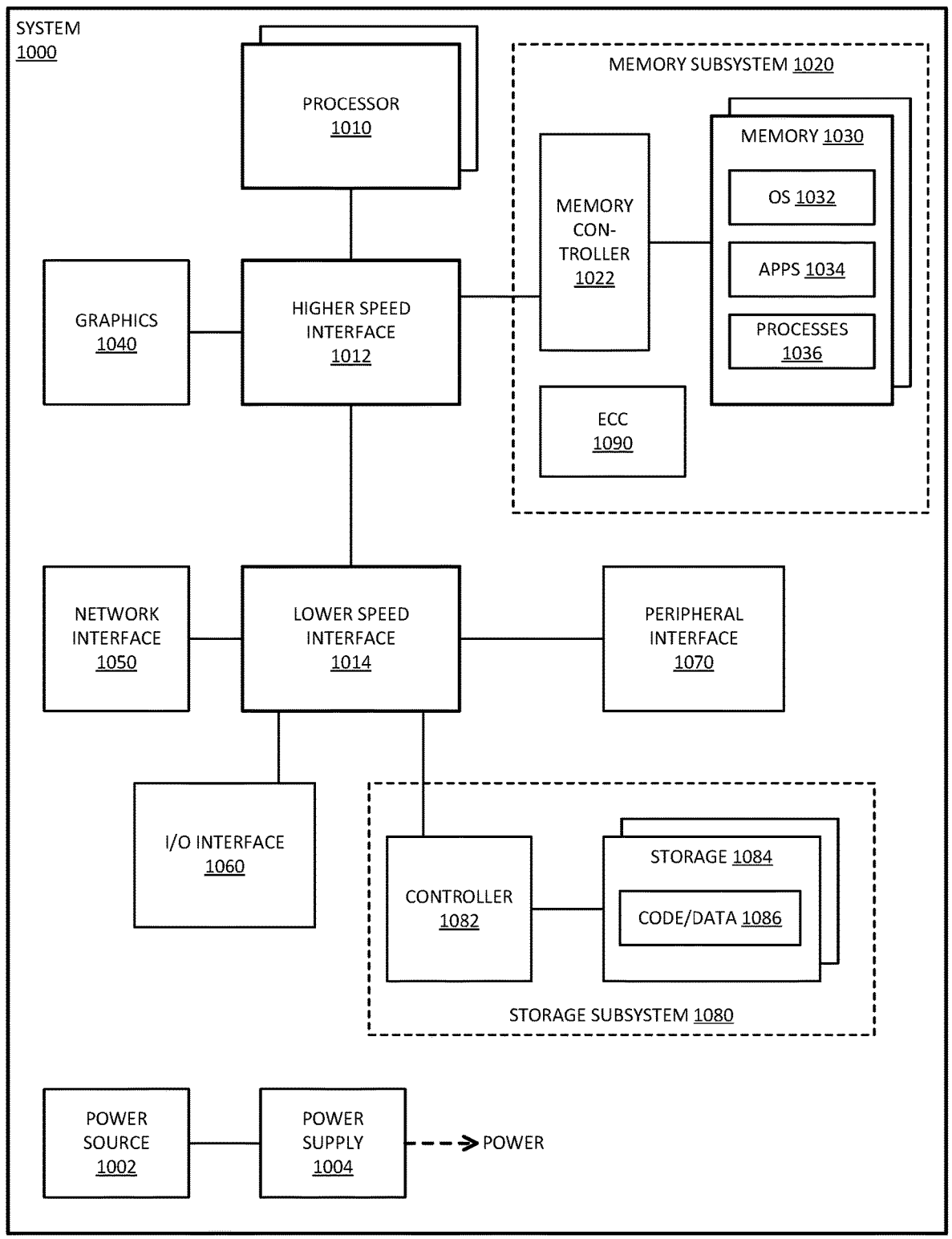
FIG. 10 is a block diagram of an embodiment of a computing system in which error checking and correction with extra system bits can be implemented.

FIG. 10 is a block diagram of an embodiment of a computing system in which error checking and correction with extra system bits can be implemented. System 1000 represents a computing device in accordance with any embodiment described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1000 includes interface 1012 coupled to processor 1010, which can represent a higher speed interface or a high throughput interface for system components that needs higher bandwidth connections, such as memory subsystem 1020 or graphics interface components 1040. Interface 1012 can represent a "north bridge" circuit, which can be a standalone component or integrated onto a processor die. Where present, graphics interface 1040 interfaces to graphics components for providing a visual display to a user of system 1000. In one embodiment, graphics interface 1040 can drive a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, the display can include a touchscreen display. In one embodiment, graphics interface 1040 generates a display based on data stored in memory 1030 or based on operations executed by processor 1010 or both. In one embodiment, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one embodiment, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 1000 includes interface 1014, which can be coupled to interface 1012. Interface 1014 can be a lower speed interface than interface 1012. In one embodiment, interface 1014 can be a "south bridge" circuit, which can include standalone components and integrated circuitry. In one embodiment, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one embodiment, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one embodiment, system 1000 includes storage subsystem 1080 to store data in a nonvolatile manner. In one embodiment, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one embodiment, storage subsystem 1080 includes controller 1082 to interface with storage 1084. In one embodiment controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1002 to provide power to the components of system 1000. In one embodiment, power supply 1004 includes an AC to DC (alternating current to direct current) adapter to plug into a wall outlet. Such AC power can be renewable energy (e.g., solar power) power source 1002. In one embodiment, power source 1002 includes a DC power source, such as an external AC to DC converter. In one embodiment, power source 1002 or power supply 1004 includes wireless charging hardware to charge via proximity to a charging field. In one embodiment, power source 1002 can include an internal battery or fuel cell source.

In one embodiment, memory subsystem 1020 includes ECC 1090, which can be an implementation of internal ECC with extra system bits in accordance with any embodiment described herein. ECC 1090 is shown as a separate element, but represents internal ECC in memory devices 1030 and system level ECC in memory controller 1022. The internal ECC generates internal ECC bits for internal ECC, and can correct an error in read data prior to sending it to memory controller 1022. ECC 1090 in accordance with an embodiment herein additionally allows memory controller 1022 and memory 1030 to exchange extra system bits. In one embodiment, system 1000 is a server device. In one embodiment in a server device, system 1000 can be one of multiple systems combined together in a server configuration. For example, the server can be implemented as a blade server combined with other blade servers in a chassis system.

Figure 11:
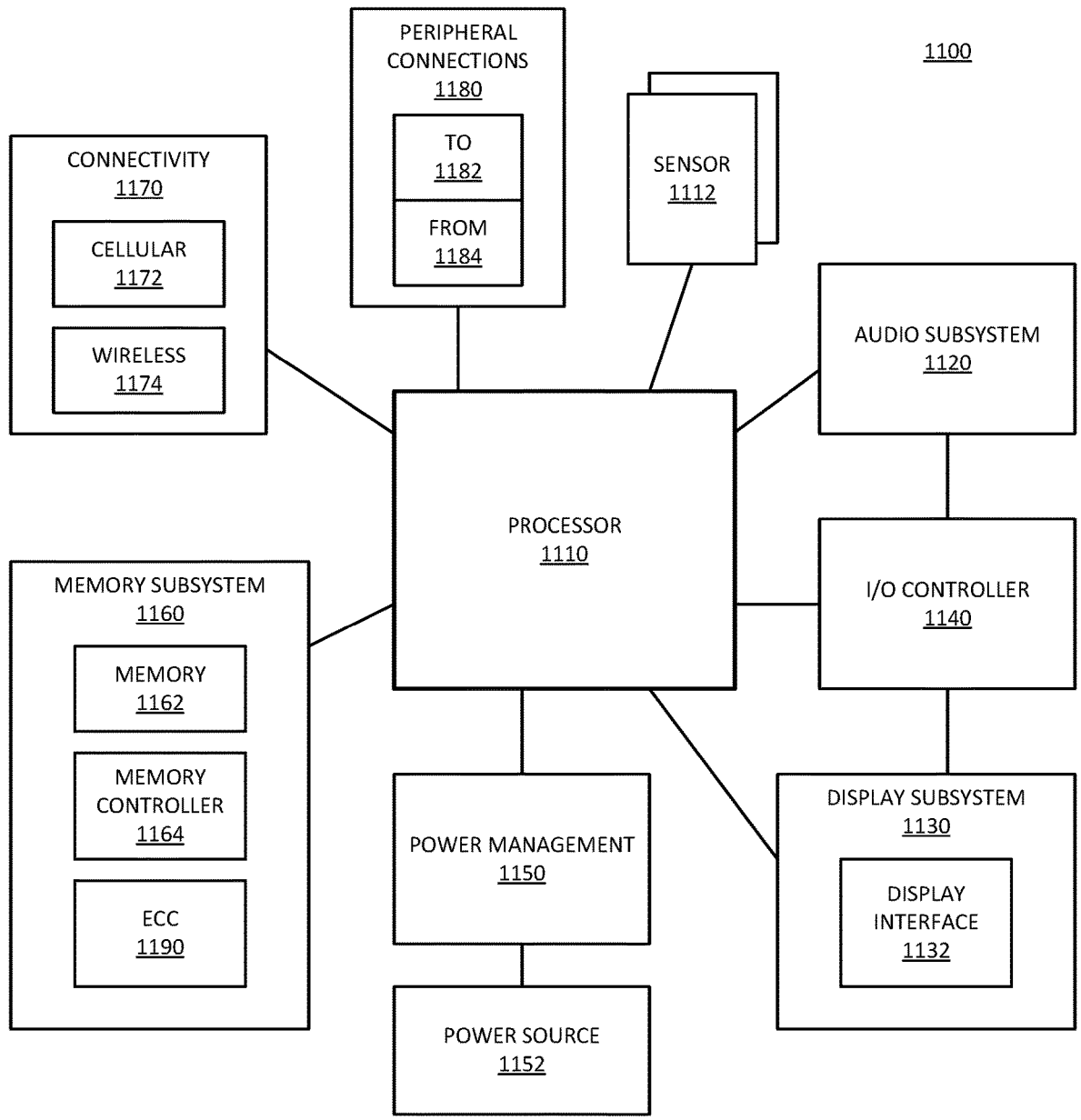
FIG. 11 is a block diagram of an embodiment of a mobile device in which error checking and correction with extra system bits can be implemented.

FIG. 11 is a block diagram of an embodiment of a mobile device in which error checking and correction with extra system bits can be implemented. Device 1100 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 1100.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting device 1100 to another device, or a combination. The processing operations can also include operations related to audio I/O, display I/O, or other interfacing, or a combination. Processor 1110 can execute data stored in memory. Processor 1110 can write or edit data stored in memory.

In one embodiment, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one embodiment, one or more sensors 1112 couples to processor 1110 via a frontend circuit integrated with processor 1110. In one embodiment, one or more sensors 1112 couples to processor 1110 via another component of system 1100.

In one embodiment, device 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1100, or connected to device 1100. In one embodiment, a user interacts with device 1100 by providing audio commands that are received and processed by processor 1110.

Display subsystem 1130 represents hardware (e.g., display devices) and software components (e.g., drivers) that provide a visual display for presentation to a user. In one embodiment, the display includes tactile components or touchscreen elements for a user to interact with the computing device. Display subsystem 1130 includes display interface 1132, which includes the particular screen or hardware device used to provide a display to a user. In one embodiment, display interface 1132 includes logic separate from processor 1110 (such as a graphics processor) to perform at least some processing related to the display. In one embodiment, display subsystem 1130 includes a touchscreen device that provides both output and input to a user. In one embodiment, display subsystem 1130 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem includes a touchscreen display. In one embodiment, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one embodiment, I/O controller 1140 manages devices such as accelerometers, cameras, light sensors or other environmental sensors, gyroscopes, global positioning system (GPS), or other hardware that can be included in device 1100, or sensors 1112. The input can be part of direct user interaction, as well as providing environmental input to the system to influence its operations (such as filtering for noise, adjusting displays for brightness detection, applying a flash for a camera, or other features).

In one embodiment, device 1100 includes power management 1150 that manages battery power usage, charging of the battery, and features related to power saving operation. Power management 1150 manages power from power source 1152, which provides power to the components of system 1100. In one embodiment, power source 1152 includes an AC to DC (alternating current to direct current) adapter to plug into a wall outlet. Such AC power can be renewable energy (e.g., solar power, motion based power). In one embodiment, power source 1152 includes only DC power, which can be provided by a DC power source, such as an external AC to DC converter. In one embodiment, power source 1152 includes wireless charging hardware to charge via proximity to a charging field. In one embodiment, power source 1152 can include an internal battery or fuel cell source.

Memory subsystem 1160 includes memory device(s) 1162 for storing information in device 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one embodiment, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable device 1100 to communicate with external devices. The external device could be separate devices, such as other computing devices, wireless access points or base stations, as well as peripherals such as headsets, printers, or other devices. In one embodiment, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading, uploading, changing, synchronizing) content on device 1100. Additionally, a docking connector can allow device 1100 to connect to certain peripherals that allow device 1100 to control content output, for example, to audiovisual or other systems.

In addition to a proprietary docking connector or other proprietary connection hardware, device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 1160 includes ECC 1190, which can be an implementation of internal ECC with extra system bits in accordance with any embodiment described herein. ECC 1190 is shown as a separate element, but represents internal ECC in memory devices 1162 and system level ECC in memory controller 1164. The internal ECC generates internal ECC bits for internal ECC, and can correct an error in read data prior to sending it to memory controller 1164. ECC 1190 in accordance with an embodiment herein additionally allows memory controller 1164 and memory 1162 to exchange extra system bits. In one embodiment, system 1100 is a server device. In one embodiment in a server device, system 1100 can be one of multiple systems combined together in a server configuration. For example, the server can be implemented as a blade server combined with other blade servers in a chassis system.

In one aspect, a dynamic random access memory (DRAM) device includes: a memory array with addressable memory locations; an internal error checking and correction (ECC) circuit to perform internal ECC, including to generate and apply check bits within the DRAM device, wherein the memory array is to provide $2N$ memory locations for $N+1$ internal check bits for internal ECC of $2^N$ data bits, where N is an integer greater than 1; and a hardware input/output interface to couple to a memory controller, wherein the input/output interface is to provide access to one or more of the ($2N$ minus ($N+1$)) memory locations to the memory controller as extra bits for system ECC information, wherein the system ECC information is separate from the internal ECC.

In one embodiment, N is 8. In one embodiment, the memory array is to provide the 16 memory locations over four cachelines, wherein the four cachelines include one extra bit. In one embodiment, the memory array is to provide the 16 memory locations over four cachelines, wherein at least one of the four cachelines includes two extra bits. In one embodiment, the internal ECC circuit is to perform single bit error (SBE) correction independent of system ECC managed by the memory controller. In one embodiment, the input/output interface is to exchange data bits with the memory controller in connection with a memory access operation, wherein the extra bits are exchanged at a slower bit rate than the data bits. In one embodiment, the input/output interface is to couple in parallel with M additional DRAM devices over a data bus to the memory controller, where M is an integer greater than 1, and wherein the DRAM devices are to exchange a portion of the $2^N$ data bits to the memory controller over a $2N$ transfer cycle burst. In one embodiment, M is 8 for nine total DRAM devices. In one embodiment, the data bus comprises a 40 bit channel, with 4 DRAM devices having a ×5 data bus interface, and 5 DRAM devices having a ×4 data bus interface. In one embodiment, the DRAM devices with the ×5 data bus interface are to exchange data bits on four of the five signal lines of the ×5 interface, and to exchange the extra bits on the fifth signal line. In one embodiment, the data bus comprises a 36 bit channel, wherein the transfer cycle burst includes at least an extra cycle burst to transfer the extra bits. In one embodiment, the memory devices comprise memory devices on a dual inline memory module (DIMM). In one embodiment, the DRAM device comprises one of multiple DRAM dies in a multichip memory package. In one embodiment, the DRAM device comprises a DRAM device compatible with a double data rate (DDR) standard.

In one aspect, a system includes: a data bus of signal lines; a memory controller coupled to the data bus; and one or more dynamic random access memory (DRAM) devices coupled to the memory controller via the data bus, the DRAM devices in accordance with any DRAM device in the previous two paragraphs. In one embodiment, the system further comprising one or more of a multicore processor coupled to the memory controller; a network adapter coupled to exchange data between the DRAM devices and a remote network location; a display communicatively coupled to a processor; or a battery to provide power to the system.

In one aspect, a method for error management in a dynamic random access memory (DRAM) device includes: performing internal error checking and correction (ECC), including generating and applying check bits within the DRAM device; providing $2N$ memory locations for $N+1$ internal check bits for internal ECC of $2^N$ data bits, where N is an integer greater than 1; and providing access to one or more of the ($2N$ minus ($N+1$)) memory locations to a memory controller as extra bits for system ECC information, wherein the system ECC information is separate from the internal ECC. The method can be in accordance with any embodiment of a DRAM device as set forth above.

In one aspect, an apparatus comprises means for performing operations to execute a method in accordance with the preceding method for error management. In one aspect, an article of manufacture comprising a computer readable storage medium having content stored thereon, which when accessed provides instructions to cause a computer device to perform operations to execute a method in accordance with the preceding method for error management.

In one aspect, a memory controller includes: a hardware input/output interface to couple to one or more memory devices over a data bus; transmit circuitry to transmit to the one or more memory devices for a write operation, $2^N$ data bits and at least $N+1$ check bits over a $2N$ transfer cycle burst, where N is an integer greater than 1; and receive circuitry to receive from the one or more memory devices for a read operation, $2^N$ data bits and at least $N+1$ check bits over a $2N$ transfer cycle burst.

In one embodiment, N is 8. In one embodiment, the number of memory devices comprises 8. In one embodiment, the receive circuitry is to receive $2N$ check bits. In one embodiment, the $2N$ check bits include ($N+1$) check bits generated by the memory controller for ECC (error checking and correction) of the $2^N$ data bits, and up to ($2N$ minus ($N+1$)) extra check bits generated based on internal ECC on the memory devices. In one embodiment, the one or more memory devices comprise memory devices on a dual inline memory module (DIMM). In one embodiment, the data bus comprises a 36 bit channel. In one embodiment, the one or more memory devices comprise a single memory device package with multiple DRAM dies. In one embodiment, the one or more memory devices comprise memory devices compliant with a double data rate (DDR) standard.

In one aspect, a method for accessing a memory includes: transmitting to one or more memory devices for a write operation, $2^N$ data bits and at least N+1 check bits over a 2N transfer cycle burst, where N is an integer greater than 1; and receiving from the one or more memory devices for a read operation, $2^N$ data bits and at least N+1 check bits over a 2N transfer cycle burst.

In one embodiment, N is 8. In one embodiment, the number of memory devices comprises 8. In one embodiment, receiving comprises receiving 2N check bits. In one embodiment, the 2N check bits include (N+1) check bits generated by the memory controller for ECC (error checking and correction) of the $2^N$ data bits, and up to (2N minus (N+1)) extra check bits generated based on internal ECC on the memory devices. In one embodiment, the one or more memory devices comprise memory devices on a dual inline memory module (DIMM). In one embodiment, the data bus comprises a 36 bit channel. In one embodiment, the one or more memory devices comprise a single memory device package with multiple DRAM dies. In one embodiment, the one or more memory devices comprise memory devices compliant with a double data rate (DDR) standard.

In one aspect, an apparatus comprises means for performing operations to execute a method in accordance with the preceding method for accessing a memory. In one aspect, an article of manufacture comprising a computer readable storage medium having content stored thereon, which when accessed provides instructions to cause a computer device to perform operations to execute a method in accordance with the preceding method for accessing a memory.

In one aspect, a dynamic random access memory (DRAM) chip includes: a hardware input/output interface to couple in parallel with M−1 additional memory devices over a data bus to a memory controller, where M is an integer greater than 1; receive circuitry to receive from the memory controller for a write operation, $(2^N)$/M data bits over a 2N transfer cycle burst, and to receive at least one of at least N+1 check bits; and transmit circuitry to transmit to the memory controller for a write operation, $(2^N)$M data bits over a 2N transfer cycle burst, and to transmit at least one of at least N+1 check bits.

In one embodiment, N is 8. In one embodiment, M is 8. In one embodiment, transmitting comprises transmitting 2N check bits. In one embodiment, further comprising: an internal ECC (error checking and correction) circuit within the DRAM chip to perform ECC operations, including to generate internal check bits for error correction within the DRAM chip prior to the sending of data to the memory controller; wherein the 2N check bits include (N+1) check bits generated by the memory controller for ECC of the $2^N$ data bits, and at least one extra check bit generated by the internal ECC circuit. In one embodiment, the memory devices comprise memory devices on a dual inline memory module (DIMM). In one embodiment, the data bus comprises a 36 bit channel. In one embodiment, the DRAM chip comprises one of multiple DRAM dies in a multichip memory package. In one embodiment, the DRAM chip comprises a DRAM device compliant with a double data rate (DDR) standard.

In one aspect, a method for interfacing with a memory controller includes: receiving from a memory controller for a write operation, $(2^N)$ divided by M data bits over a 2N transfer cycle burst, and to receive at least one of at least N+1 check bits; and transmitting to the memory controller for a write operation, $(2^N)$ times M data bits over a 2N transfer cycle burst, and to transmit at least one of at least N+1 check bits.

In one embodiment, N is 8. In one embodiment, M is 8. In one embodiment, the transmit circuitry is to transmit 2N check bits. In one embodiment, further comprising: an internal ECC (error checking and correction) circuit within the DRAM chip to perform ECC operations, including to generate internal check bits for error correction within the DRAM chip prior to the sending of data to the memory controller; wherein the 2N check bits include (N+1) check bits generated by the memory controller for ECC of the $2^N$ data bits, and at least one extra check bit generated by the internal ECC circuit. In one embodiment, the memory devices comprise memory devices on a dual inline memory module (DIMM). In one embodiment, the data bus comprises a 36 bit channel. In one embodiment, the DRAM chip comprises one of multiple DRAM dies in a multichip memory package. In one embodiment, the DRAM chip comprises a DRAM device compliant with a double data rate (DDR) standard.

In one aspect, an apparatus comprises means for performing operations to execute a method in accordance with the preceding method for accessing a memory. In one aspect, an article of manufacture comprising a computer readable storage medium having content stored thereon, which when accessed provides instructions to cause a computer device to perform operations to execute a method in accordance with the preceding method for accessing a memory.

In one aspect, a system includes: a data bus of signal lines; a memory controller coupled to the data bus; and one or more dynamic random access memory (DRAM) devices coupled to the memory controller via the data bus; wherein the memory controller and DRAM devices are to exchange $2^N$ data bits and at least N+1 check bits over a 2N transfer cycle burst for memory access operations, where N is an integer greater than 1.

In one embodiment, N is 8. In one embodiment, the memory controller and DRAM devices are to exchange 2N check bits. In one embodiment, the one or more DRAM devices further comprising: an internal ECC (error checking and correction) circuit within the DRAM devices to perform ECC operations, including to generate internal check bits for error correction within the DRAM devices prior to the sending of data to the memory controller; wherein the 2N check bits include (N+1) check bits generated by the memory controller for ECC of the $2^N$ data bits, and up to (2N minus (N+1)) extra check bits generated by the internal ECC circuits of the DRAM devices. In one embodiment, the DRAM devices comprise memory devices on a dual inline memory module (DIMM). In one embodiment, the one or more DRAM devices comprise DRAM devices compliant with a double data rate (DDR) standard. In one embodiment, further comprising one or more of a multicore processor coupled to the memory controller; a network adapter coupled to exchange data between the DRAM devices and a remote network location; a display communicatively coupled to a processor; or a battery to provide power to the system.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device, comprising:
    a memory array with addressable memory locations;
    an internal error checking and correction (ECC) circuit to perform internal ECC, including to generate and apply check bits within the DRAM device, wherein the memory array is to provide 2N memory locations for N+1 internal check bits for internal ECC of $2^N$ data bits, where N is an integer greater than 1; and
    a hardware input/output interface to couple to a memory controller, wherein the input/output interface is to provide access to the memory controller to one or more of the 2N memory locations not used by the N+1 internal check bits as extra bits for system ECC information, wherein the system ECC information is separate from the internal ECC, wherein the DRAM device is to exchange between the memory array and the memory controller a portion of the $2^N$ data bits and bits for the one or more 2N memory locations not used by the N+1 internal check bits over a 2N transfer cycle burst.

2. The DRAM device of claim 1, wherein N is 8.

3. The DRAM device of claim 2, wherein the memory array is to provide the 16 memory locations over four cachelines, wherein the four cachelines include one extra bit.

4. The DRAM device of claim 2, wherein the memory array is to provide the 16 memory locations over four cachelines, wherein at least one of the four cachelines includes two extra bits.

5. The DRAM device of claim 1, wherein the internal ECC circuit is to perform single bit error (SBE) correction independent of system ECC managed by the memory controller.

6. The DRAM device of claim 1, wherein the input/output interface is to exchange data bits with the memory controller in connection with a memory access operation, wherein the extra bits are exchanged at a slower bit rate than the data bits.

7. The DRAM device of claim 1, wherein the input/output interface is to couple in parallel with M additional DRAM devices over a data bus to the memory controller, where M is an integer greater than 1, and wherein the M+1 DRAM devices are to exchange a portion of the $2^N$ data bits to the memory controller over the 2N transfer cycle burst.

8. The DRAM device of claim 7, wherein M is 8 for nine total DRAM devices.

9. The DRAM device of claim 8, wherein the data bus comprises a 40 bit channel, with 4 DRAM devices having a ×5 data bus interface, and 5 DRAM devices having a ×4 data bus interface.

10. The DRAM device of claim 9, wherein the DRAM devices with the ×5 data bus interface are to exchange data bits on four of the five signal lines of the ×5 interface, and to exchange the extra bits on the fifth signal line.

11. The DRAM device of claim 8, wherein the data bus comprises a 36 bit channel, wherein the transfer cycle burst includes at least an extra cycle burst to transfer the extra bits.

12. The DRAM device of claim 7, wherein the DRAM devices comprise DRAM devices on a dual inline memory module (DIMM).

13. The DRAM device of claim 7, wherein the DRAM device comprises one of multiple DRAM dies in a multichip memory package.

14. The DRAM device of claim 1, wherein the DRAM device comprises a DRAM device compatible with a double data rate (DDR) standard.

15. A system comprising:
    a data bus of signal lines;
    a memory controller coupled to the data bus; and
    M dynamic random access memory (DRAM) devices coupled to the memory controller in parallel via the data bus, where M is an integer greater than 1, the DRAM devices including:
        a memory array with addressable memory locations;
        an internal error checking and correction (ECC) circuit to perform internal ECC, including to generate and apply check bits within the DRAM device, wherein the memory array is to provide 2N memory locations for N+1 internal check bits for internal ECC of 2^N data bits, where N is an integer greater than 1; and a hardware input/output interface coupled to the memory controller via the data bus, wherein the input/output interface is to provide access to the memory controller to one or more of the 2N memory locations not used by the N+1 internal check bits as extra bits for system ECC information, wherein the system ECC information is separate from the internal ECC;

wherein the M DRAM devices are to exchange the 2^N data bits and bits for the one or more 2N memory locations not used by the N+1 internal check bits over a 2N transfer cycle burst.

16. The system of claim 15, wherein N is 8.

17. The system of claim 16, wherein the memory array is to provide the 16 memory locations over four cachelines, wherein the four cachelines include one extra bit.

18. The system of claim 16, wherein the memory array is to provide the 16 memory locations over four cachelines, wherein at least one of the four cachelines includes two extra bits.

19. The system of claim 15, wherein the input/output interface is to exchange data bits with the memory controller in connection with a memory access operation, wherein the extra bits are exchanged at a slower bit rate than the data bits.

20. The system of claim 15, wherein M is 8 for nine total DRAM devices, and wherein the data bus comprises a 40 bit channel, with 4 DRAM devices having a ×5 data bus interface, and 5 DRAM devices having a ×4 data bus interface.

21. The system of claim 15, wherein the DRAM devices comprise memory devices on a dual inline memory module (DIMM).

22. The system of claim 15, wherein the DRAM device comprises a DRAM device compatible with a double data rate (DDR) standard.

23. The system of claim 15, further comprising one or more of a multicore processor coupled to the memory controller;
a network adapter coupled to exchange data between the DRAM devices and a remote network location;
a display communicatively coupled to a processor; or
a battery to provide power to the system.

* * * * *